(12) United States Patent
Tan et al.

(10) Patent No.: US 10,108,086 B2
(45) Date of Patent: Oct. 23, 2018

(54) SYSTEM AND METHODS OF MOLD/SUBSTRATE SEPARATION FOR IMPRINT LITHOGRAPHY

(71) Applicant: Nanonex Corporation, Monmouth Junction, NJ (US)

(72) Inventors: Hua Tan, Princeton Junction, NJ (US); Lin Hu, Livingston, NJ (US); Stephen Y. Chou, Princeton, NJ (US)

(73) Assignee: NANONEX CORPORATION, Monmouth Junction, NJ (US)

( * ) Notice: Subject to any disclaimer, the term of this patent is extended or adjusted under 35 U.S.C. 154(b) by 292 days.

(21) Appl. No.: 14/776,607

(22) PCT Filed: Mar. 17, 2014

(86) PCT No.: PCT/US2014/030655
§ 371 (c)(1),
(2) Date: Sep. 14, 2015

(87) PCT Pub. No.: WO2014/145826
PCT Pub. Date: Sep. 18, 2014

(65) Prior Publication Data
US 2016/0031151 A1    Feb. 4, 2016

Related U.S. Application Data

(60) Provisional application No. 61/791,491, filed on Mar. 15, 2013, provisional application No. 61/799,681, (Continued)

(51) Int. Cl.
*G03F 7/00* (2006.01)
*B82Y 40/00* (2011.01)
(Continued)

(52) U.S. Cl.
CPC ............ *G03F 7/0002* (2013.01); *B29C 43/50* (2013.01); *B29C 43/56* (2013.01); *B29C 43/58* (2013.01);
(Continued)

(58) Field of Classification Search
CPC ..................................................... G03F 7/0002
See application file for complete search history.

(56) References Cited

U.S. PATENT DOCUMENTS 1,048,281 A    12/1912    Bing
2,124,711 A    7/1938    Rowell
(Continued)

FOREIGN PATENT DOCUMENTS

JP    2003077867    3/2003
WO    2001042858 A1    6/2001
(Continued)

OTHER PUBLICATIONS

Keil et al, Journal Vaccum Science & Technology, B 22(6) Nov./Dec. 2004, "Process Development and Characterization of Antisticking Layers on Nickel-based Stamps Designed for Nanoimprint Lithography."
(Continued)

*Primary Examiner* — Benjamin A Schiffman
(74) *Attorney, Agent, or Firm* — Siu Lo; Julian Gonzalez; Venkatesh Hariharan

(57) ABSTRACT

A nanoimprint system and methods for separating imprinted substrates with nano-scale patterns from mold for manufacturing. Generally, the system includes means to create, monitor, and control relative movement between the mold and substrate for separation. It is capable of controlling where and when the separation happens and finishes. The relative movement may be generated by motion stages, springs, stage driven flexures, inflatable O-rings, gas flow,
(Continued)

and other mechanical means. It may be monitored by separation force, overhead camera, and vacuum/pressures in different area of the system. The relative movement may be any combination of stages movements and movement sequences. The separation speed, direction, and force can be well controlled in the system to achieve fast and reliable separation between mold and substrate, and at the same time maintain the pattern shape and details on the consolidated imprint resist.

21 Claims, 38 Drawing Sheets

Related U.S. Application Data filed on Mar. 15, 2013, provisional application No. 61/799,856, filed on Mar. 15, 2013.

(51) Int. Cl.
*B82Y 10/00* (2011.01)
*B29C 43/50* (2006.01)
*B29C 43/56* (2006.01)
*B29C 43/58* (2006.01)
*B29C 59/02* (2006.01)

(52) U.S. Cl.
CPC .......... *B29C 59/022* (2013.01); *B29C 59/026* (2013.01); *B82Y 10/00* (2013.01); *B82Y 40/00* (2013.01); *B29C 2043/563* (2013.01); *B29C 2043/5808* (2013.01); *B29C 2043/5833* (2013.01); *B29C 2043/5891* (2013.01)

(56) References Cited

U.S. PATENT DOCUMENTS

| | | |
|---|---|---|
| 2,285,080 A | 6/1942 | Berge |
| 3,485,908 A | 12/1969 | Burger |
| 3,678,889 A | 7/1972 | Murakami et al. |
| 3,830,194 A | 8/1974 | Benzing et al. |
| 3,830,681 A | 8/1974 | Wilson |
| 4,112,030 A | 9/1978 | Kremzow |
| 4,506,815 A | 3/1985 | Melas et al. |
| 4,524,716 A | 6/1985 | Mueller |
| 4,593,740 A | 6/1986 | Buhler |
| 5,772,905 A | 6/1998 | Chou |
| 5,804,017 A | 9/1998 | Hector |
| 5,947,027 A | 9/1999 | Burgin et al. |
| 6,235,118 B1 | 5/2001 | Hayashi |
| 6,286,452 B1 | 9/2001 | Namiki et al. |
| 6,309,580 B1 | 10/2001 | Chou |
| 6,482,742 B1 | 11/2002 | Chou |
| 6,518,189 B1 | 2/2003 | Chou |
| 6,578,891 B1 | 6/2003 | Suzuki et al. |
| 6,696,099 B2 | 2/2004 | Ro |
| 6,696,220 B2 | 2/2004 | Bailey et al. |
| 6,805,054 B1 | 10/2004 | Meissl et al. |
| 6,828,244 B2 | 12/2004 | Chou |
| 6,900,881 B2 | 5/2005 | Sreenivasan et al. |
| 6,908,861 B2 | 6/2005 | Screenivasan et al. |
| 7,137,803 B2 | 11/2006 | Chou |
| 7,294,294 B1 | 11/2007 | Wago et al. |
| 7,322,287 B2 | 1/2008 | Tan et al. |
| 7,537,658 B2 | 5/2009 | Nasu et al. |
| 8,329,089 B2 | 12/2012 | Kim et al. |
| 8,377,361 B2 | 2/2013 | Zhang et al. |
| 8,632,720 B2 | 1/2014 | Zhang et al. |
| 8,747,092 B2 | 6/2014 | Zhang et al. |
| 2002/0115002 A1 | 8/2002 | Bailey et al. |
| 2002/0134512 A1 | 9/2002 | Adachi et al. |
| 2003/0064604 A1 | 4/2003 | Umeda |
| 2003/0159608 A1 | 8/2003 | Heidari |
| 2003/0196763 A1 | 10/2003 | Miyamoto et al. |
| 2004/0008334 A1 | 1/2004 | Sreenivasan et al. |
| 2004/0202865 A1 | 10/2004 | Homola et al. |
| 2004/0251775 A1 | 12/2004 | Choi et al. |
| 2005/0042553 A1 | 2/2005 | Lu et al. |
| 2005/0056216 A1 | 3/2005 | Kuse |
| 2005/0116370 A1 | 6/2005 | Ogino et al. |
| 2005/0145119 A1 | 7/2005 | Tan et al. |
| 2005/0146078 A1 | 7/2005 | Chou et al. |
| 2005/0170269 A1 | 8/2005 | Nakagawa et al. |
| 2005/0271900 A1 | 12/2005 | Kobrin et al. |
| 2005/0275125 A1 | 12/2005 | Kawakami et al. |
| 2006/0037997 A1 | 2/2006 | Higashi et al. |
| 2006/0131785 A1 | 6/2006 | Sewell |
| 2006/0157444 A1 | 7/2006 | Nakamura et al. |
| 2006/0172549 A1 | 8/2006 | Choi et al. |
| 2006/0172553 A1 | 8/2006 | Choi et al. |
| 2006/0219754 A1 | 10/2006 | Clauberg et al. |
| 2006/0222899 A1 | 10/2006 | Sugimura et al. |
| 2006/0262393 A1 | 11/2006 | Toyoda |
| 2006/0273488 A1 | 12/2006 | Seki et al. |
| 2006/0292463 A1 | 12/2006 | Best et al. |
| 2007/0059497 A1 | 3/2007 | Huang et al. |
| 2007/0114686 A1 | 5/2007 | Choi et al. |
| 2007/0166557 A1 | 7/2007 | Keil et al. |
| 2007/0190200 A1 | 8/2007 | Cherala et al. |
| 2007/0228589 A1 | 10/2007 | Choi et al. |
| 2008/0122144 A1 | 5/2008 | Zhang et al. |
| 2008/0131623 A1 | 6/2008 | Zhang et al. |
| 2008/0188070 A1 | 8/2008 | Johnson et al. |
| 2008/0202365 A1* | 8/2008 | Schneider ................ B41K 3/02 101/287 |
| 2008/0204684 A1 | 8/2008 | Cho et al. |
| 2008/0213418 A1 | 9/2008 | Tan et al. |
| 2009/0140445 A1 | 6/2009 | Lu et al. |
| 2010/0173032 A1 | 7/2010 | Suehira et al. |
| 2010/0201042 A1 | 8/2010 | Sreenivasan et al. |
| 2010/0244324 A1 | 9/2010 | Zhang et al. |
| 2011/0180965 A1 | 7/2011 | Zhang et al. |
| 2011/0183070 A1* | 7/2011 | Choi ................ B29C 43/021 427/278 |
| 2012/0019921 A1 | 1/2012 | Yamada |
| 2012/0299222 A1 | 11/2012 | Lan et al. |
| 2014/0102327 A1* | 4/2014 | Theis ................ B41F 17/00 101/253 |
| 2014/0239529 A1 | 8/2014 | Tan et al. |

FOREIGN PATENT DOCUMENTS

| | | |
|---|---|---|
| WO | 2003090985 A1 | 11/2003 |
| WO | 2004021083 A1 | 3/2004 |

OTHER PUBLICATIONS

Po-Ching Kao et al, IEEE Transactions on Electronic Devices—V52 N8—Aug. 2005, "Fabrication of Large-Scaled Organic Light Emitting Devices on the Flexible Substrates Using Low-Pressure Imprinting Lithography."
Henri Jansen et al, J. Micromech, Microeng, 6 (1996) 14-28, "A Survey on the Reactive Ion Etching of Silicon in Microtechnology."
PCT Search Report, PCT US 2014/030106, dated Aug. 1, 2014.
PCT Search Report, PCT US 2014/030655, dated Sep. 10, 2014.

* cited by examiner

SYSTEM AND METHODS OF MOLD/SUBSTRATE SEPARATION FOR IMPRINT LITHOGRAPHY

CROSS-REFERENCE TO RELATED APPLICATIONS

This application is a National Stage of International Application No. PCT/US14/30655, filed on Mar. 17, 2014, which claims the benefit of U.S. Provisional Applications Nos. 61/791,491, 61/799,681, and 61/799,856, each of which were filed on Mar. 15, 2013, the disclosures of which are incorporated herein by reference.

FIELD

The present disclosure relates to system and methods for roller imprint lithography. It is particularly useful for fast mass production of substrates with replication of patterns from a mold having microscale or nanoscale features by imprint lithography, including roller imprint lithography.

BACKGROUND

The statements in this section merely provide background information related to the present disclosure and may not constitute prior art.

Nanoimprint lithography, also often called imprint lithography, is capable of replicating patterns on a pre-made mold as small as several nanometers. The pre-made mold has extruded areas and recessed areas on its replication surface, which constitute patterns of various shapes and sizes. The mold was typically made by a patterning step using electron beam lithography (EBL) or mixing of EBL and optical lithography, and, a follow-up etching step using reactive ion etching (RIE) to create the patterns. Nanoimprint lithography starts from applying a volume of polymer onto a substrate by either spinning or dispensing. The polymer is either flowable in ambient temperature, or, from rigid to deformable or flowable by thermally heating. Then, the pre-made mold is positioned to contact with the substrate. After that, the mold is pressed against the substrate. If the polymer is in liquid in ambient temperature, pressing the mold against the substrate will force the surface extrusion areas on the mold replication surface to go into the layer of the polymer. If the polymer is rigid in ambient temperature, a thermally heating step is conducted prior to the contact, after the contact but before the pressing, or during the pressing to make the polymer deformable or flowable. Thus, pressing the mold against the mold is able to force the surface extrusion areas on the mold replication surface to go into the layer of the polymer. When the extruded areas completely go into the layer of the polymer, the polymer is transited from deformable or flowable into rigid by UV radiation, thermally heating or thermally cooling depending on types of the polymer. At last, the mold is released from the substrate while the layer of the polymer attaches to the substrate. To prevent the polymer from sticking to the mold, a very thin release coating may be deposited on the replication surface of the mold. Typical release coating included surface release surfactant and per-fluoro polymer deposited by CVD. After the substrate is separated from the mold, the extrusion areas on the mold surface are corresponding to the recessed areas in the polymer layer. Therefore, a reverse-tone replication of the patterns on the mold is formed onto the polymer film on the substrate. The polymer may be a thermo-plastic polymer or curable polymer. A thermo-plastic polymer transits from rigid to deformable or flowable when being heated above its glass transition temperature, and, vice versus when is cooled below its glass transition temperature. A curable polymer is deformable or flowable originally, and transit to rigid when being heating to curing temperature for thermo-set type or being cured under UV exposure for UV-curable type. When alignment is needed, the mold is aligned with the substrate through a set of matching align markers prior to the contact. Previously, electron beam lithography is very slow to write nanoscale patterns. It is unlikely to use it for mass production of nanoscale devices. Nanoimprint lithography is able to replicate whole area of patterned surface of the pre-made mold onto the substrate by one cycle of the process. It can dramatically increase the efficiency of patterning nanoscale features. Because the mold is repeatedly used for many cycles of imprinting, the high cost of using electron beam lithography to make the mold is averaged into these many imprints. Nanoimprint lithography delivers a practical method to produce nanoscale devices at low cost.

Since its invention in 1995 by Stephen Y. Chou (referring to U.S. Pat. No. 5,772,905), nanoimprint lithography has successfully demonstrated its capability of replicating a feature as small as 5 nm. Meanwhile, many research works were carried out on developing resists for imprinting, mold making techniques, mold release coating for clean separation, and apparatus to do imprinting. In overall, nanoimprint lithography has evolved into being a widely used technology for research laboratories, but not reached a stage ready to meet much higher requirements of industrial use. One of the improvements needed for industrial use is an effective method to separate imprinted substrate from mold with high throughput and no damage to the patterns.

Fast nanoimprint apparatus with capability to separate mold and substrate automatically is highly demanded by semiconductor, magnetic media, and other industries to use this technology to manufacture micro-scale and nano-scale device products. Previously a fast nanoimprint apparatus was used to deform the mold to separate it from the substrate after imprint. (patent application Ser. No. 13/011,844) The setup was placed in a chamber where a deformable mold is fixed firmly around its full periphery. In the patent, the mold has to be deformable, which limits the thickness and material of the mold to be used. The loading and unloading of the mold is difficult giving the fact that the periphery of the mold are fixed firmly. In addition, the separation motion of the substrate is in the Z direction only. There is nothing to monitor the separation process, which could be important in a manufacturing environment.

Nanoimprint lithography, also often called imprint lithography, is capable of replicating patterns on a pre-made mold as small as several nanometers. The pre-made mold has extruded areas and recessed areas on its replication surface, which constitute patterns of various shapes and sizes. The mold was typically made by a patterning step using electron beam lithography (EBL) or mixing of EBL and optical lithography, and, a follow-up etching step using reactive ion etching (RIE) to create the patterns. Nanoimprint lithography starts from applying a volume of polymer onto a substrate by either spinning or dispensing. The polymer is either flowable in ambient temperature, or, from rigid to deformable or flowable by thermally heating. Then, the pre-made mold is positioned to contact with the substrate. After that, the mold is pressed against the substrate. If the polymer is in liquid in ambient temperature, pressing the mold against the substrate will force the surface extrusion areas on the mold replication surface to go into the layer of the polymer. If the polymer is rigid in ambient temperature, a thermally heating step is conducted prior to the contact, after the contact but before the pressing, or during the pressing to make the polymer deformable or flowable. Thus, pressing the mold against the mold is able to force the surface extrusion areas on the mold replication surface to go into the layer of the polymer. When the extruded areas completely go into the layer of the polymer, the polymer is transited from deformable or flowable into rigid by UV radiation, thermally heating or thermally cooling depending on types of the polymer. At last, the mold is released from the substrate while the layer of the polymer attaches to the substrate. To prevent the polymer from sticking to the mold, a very thin release coating may be deposited on the replication surface of the mold. Typical release coating included surface release surfactant and per-fluoro polymer deposited by CVD. After the substrate is separated from the mold, the extrusion areas on the mold surface are corresponding to the recessed areas in the polymer layer. Therefore, a reverse-tone replication of the patterns on the mold is formed onto the polymer film on the substrate. The polymer may be a thermo-plastic polymer or curable polymer. A thermo-plastic polymer transits from rigid to deformable or flowable when being heated above its glass transition temperature, and, vice versus when it is cooled below its glass transition temperature. A curable polymer is deformable or flowable originally, and transit to rigid when being heating to curing temperature for thermo-set type or being cured under UV exposure for UV-curable type. When alignment is needed, the mold is aligned with the substrate through a set of matching align markers prior to the contact. Previously, electron beam lithography is very slow to write nanoscale patterns. It is unlikely to use it for mass production of nanoscale devices. Nanoimprint lithography is able to replicate whole area of patterned surface of the pre-made mold onto the substrate by one cycle of the process. It can dramatically increase the efficiency of patterning nanoscale features. Because the mold is repeatedly used for many cycles of imprinting, the high cost of using electron beam lithography to make the mold is averaged into these many imprints. Nanoimprint lithography delivers a practical method to produce nanoscale devices at low cost.

Since its invention in 1995 by Stephen Y. Chou (referring to U.S. Pat. No. 5,772,905), nanoimprint lithography has successfully demonstrated its capability of replicating a feature as small as 5 nm. Meanwhile, many research works were carried out on developing resists for imprinting, mold making techniques, mold release coating for clean separation, and apparatus to do imprinting. In overall, nanoimprint lithography has evolved into being a widely used technology for research laboratories, but not reached a stage ready to meet much higher requirements of industrial use. One of the improvements needed by industrial use is imprint system and method with high throughput and overlay accuracy.

Fast nanoimprint apparatus is highly demanded by semiconductor, magnetic media, and optics industries to use this technology to manufacture nano-scale device products. However, traditional nanoimprint lithography is still improving the throughput, and certain application requires very large (a few meters) substrate, which is difficult for traditional nanoimprint lithography to provide.

Roller Imprint Lithography, offering a much simpler nanoimprint lithography machine design, much higher throughput, and lower cost, is a very attractive alternative to traditional nanoimprint. Since its invention in 1998 (Referring to "Roller Nanoimprint Lithography" paper on J. Vac. Sci. Technol. B 16(6)), various research efforts have been dedicated to the roller nanoimprint. To fully utilize the potential of the roller nanoimprint, some of the key areas still need further improvement. These include: a) to make an ultra-high quality and uniform imprint; b) have ways to place on a roller with microscale or nanoscale patterns which can then continuously imprint the substrate.

Optical lithography techniques are currently used to make most microelectronic devices. However, it is believed that these methods are reaching their limits in resolution. Submicron scale lithography has been a critical process in the microelectronics industry. The use of sub-micron scale lithography allows manufacturers to meet the increased demand for smaller and more densely packed electronic circuits on chips. It is expected that the microelectronics industry will pursue structures that are as small as or smaller than about 50 nm. Further, there are emerging applications of nanometer scale lithography in the areas of opto-electronics and magnetic storage. For example, photonic crystals and high-density patterned magnetic memory of the order of terabytes per square inch may require sub-100 nm scale lithography.

For making sub-50 nm structures, optical lithography techniques may require the use of very short wavelengths of light (e.g., about 13.2 nm). At these short wavelengths, many common materials are not optically transparent and therefore imaging systems typically have to be constructed using complicated reflective optics. Furthermore, obtaining a light source that has sufficient output intensity at these wavelengths is difficult. Such systems lead to extremely complicated equipment and processes that may be prohibitively expensive. It is also believed that high-resolution e-beam lithography techniques, though very precise, are too slow for high-volume commercial applications.

Nanoimprint lithography, also often called imprint lithography, is capable of replicating patterns on a pre-made mold as small as several nanometers. The pre-made mold has extruded areas and recessed areas on its replication surface, which constitute patterns of various shapes and sizes. The mold was typically made by a patterning step using electron beam lithography (EBL) or mixing of EBL and optical lithography, and, a follow-up etching step using reactive ion etching (RIE) to create the patterns. Nanoimprint lithography starts from applying a volume of polymer onto a substrate by either spinning or dispensing. The polymer is either flowable in ambient temperature, or, from rigid to deformable or flowable by thermally heating. Then, the pre-made mold is positioned to contact with the substrate. After that, the mold is pressed against the substrate. If the polymer is in liquid in ambient temperature, pressing the mold against the substrate will force the surface extrusion areas on the mold replication surface to go into the layer of the polymer. If the polymer is rigid in ambient temperature, a thermally heating step is conducted prior to the contact, after the contact but before the pressing, or during the pressing to make the polymer deformable or flowable. Thus, pressing the mold against the mold is able to force the surface extrusion areas on the mold replication surface to go into the layer of the polymer. When the extruded areas completely go into the layer of the polymer, the polymer is transited from deformable or flowable into rigid by UV radiation, thermally heating or thermally cooling depending on types of the polymer. At last, the mold is released from the substrate while the layer of the polymer attaches to the substrate. To prevent the polymer from sticking to the mold, a very thin release coating may be deposited on the replication surface of the mold. Typical release coating included surface release surfactant and per-fluoro polymer deposited by CVD. After the substrate is separated from the mold, the extrusion areas on the mold surface are corresponding to the recessed areas in the polymer layer. Therefore, a reverse-tone replication of the patterns on the mold is formed onto the polymer film on the substrate. The polymer may be a thermo-plastic polymer or curable polymer. A thermo-plastic polymer transits from rigid to deformable or flowable when being heated above its glass transition temperature, and, vice versus when is cooled below its glass transition temperature. A curable polymer is deformable or flowable originally, and transit to rigid when being heating to curing temperature for thermo-set type or being cured under UV exposure for UV-curable type. When alignment is needed, the mold is aligned with the substrate through a set of matching align markers prior to the contact. Previously, electron beam lithography is very slow to write nanoscale patterns. It is unlikely to use it for mass production of nanoscale devices. Nanoimprint lithography is able to replicate whole area of patterned surface of the pre-made mold onto the substrate by one cycle of the process. It can dramatically increase the efficiency of patterning nanoscale features. Because the mold is repeatedly used for many cycles of imprinting, the high cost of using electron beam lithography to make the mold is averaged into these many imprints. Nanoimprint lithography delivers a practical method to produce nanoscale devices at low cost.

Since its invention in 1995 by Stephen Y. Chou (referring to U.S. Pat. No. 5,772,905), nanoimprint lithography has successfully demonstrated its capability of replicating a feature as small as 5 nm. Meanwhile, many research works were carried out on developing resists for imprinting, mold making techniques, mold release coating for clean separation, and apparatus to do imprinting. Overall nanoimprint lithography has evolved into being a widely used technology for research laboratories, but not reached a stage ready to meet much higher requirements of industrial use. One of the needed improvements however as identified by the present inventors is for industrial use is step and repeat imprint system and method with good imprint uniformity, high throughput and overlay accuracy.

SUMMARY

The embodiments of this disclosure include systems and methods to separate substrates from mold after imprint resist solidification. Generally, the system has an apparatus to hold mold and an apparatus to hold substrate. A hollow mold holder is fixed to the top inner surface of the chamber and positioned underneath the transparent top section. By changing the type of mold holders used in the system, molds of different materials or different sizes and thicknesses may be fixed to the mold holder and carry out imprint. More specifically, transparent, semi-transparent or opaque molds (all referring to visible wavelength) may be used in the system for nanoimprint. An enclosed volume referring to mold mini-chamber is formed between the mold/holder and top wall of the chamber. Inside chamber, a stage assembly, leveling apparatus, and force sensing apparatus are installed. A chuck to vacuum hold a substrate is mounted on top of the stage assembly. At beginning of the imprinting, the substrate with a layer of resist is positioned underneath the mold at a predetermined gap between them. Then, the substrate is moved up to contact with the mold either under vacuum, under atmosphere or under pressure from a mixture of different gases. The substrate and mold may be pressed further by introducing higher pressure inside the chamber. After consolidating the resist, the substrate is separated from the mold by motions enabled by stage movements, or by deforming the mold enabled by differential pressure between the mold mini-chamber and the bulk volume of the chamber, or a mixing of both.

The disclosed systems, apparatuses and methods relate to high throughput and high speed continuous producing of micro-scale and nano-scale patterns using roller nanoimprint lithography (RNIL). Generally, the roller system is modular: it has a section for resist coating and a section for nanoimprint. Unwinding roller and rewinding roller are located on the two ends of the system.

The key component of the system is a special designed Air Cushion Press (ACP) head with UV/Thermal heating source. It is capable of applying fluid pressure at the same time curing the resists. At the nanoimprint section, the mold will contact with the substrate with an adjustable base pressure. The ACP head will apply a uniform pressure where the resist is cured.

This disclosure demonstrated ways to apply air cushion press to six forms of roller molds and substrates, which includes rigid flat mold, roller mold, flexible mold, rigid substrate, and flexible substrate.

This disclosure also demonstrated ways to apply resist coating on the substrate surface. A resist coating wheel may be used to contact the resist first, and then rotate to contact substrate, bring the resist to the surface of substrate. A resist thickness controller will be able to control the resist coated. A different coating method uses dispensing head to place low viscosity (0.1-200 cP) resist droplets on the surface of substrate. Vapor treatment may be used to help the adhesion.

This disclosure further demonstrated five different ways to pattern roller molds with micro-scale and nano-scale features.

This disclosed system and methods include forming a layer on a region of a substrate. It includes, inter alia, positioning a liquid on a substrate and contacting the liquid with the mold to carry out imprint. Upon separation, the process will continue until all regions of the substrate are patterned by the mold. Substrates with micro-scale and nano-scale patterns can be mass produced using the system and methods.

A multi-axis robot is used to transfer the imprint molds and substrates to the chamber. Multiple and different end effectors may be mounted on the same robot to handle molds and substrates of different form factors. Positions and orientations of molds and substrates may be adjusted at different stations in the system. Before imprint, the molds are adjusted with the patterned side facing down, while the substrates are adjusted with the patterned side facing up. After all the imprints are finished, the molds may be adjusted with the patterned side facing up before placing back into the mold cassette.

Further aspects of the present disclosure will be in part apparent and in part pointed out below. It should be understood that various aspects of the disclosure may be implemented individually or in combination with one another. It should also be understood that the detailed description and drawings, while indicating certain exemplary embodiments, are intended for purposes of illustration only and should not be construed as limiting the scope of the disclosure.

BRIEF DESCRIPTION OF THE DRAWINGS

The features, nature and advantages of this disclosure will be more clearly understood by consideration of the illustrative embodiments now to be described in detail in connection with the accompanying drawing. In the drawing.

Figure 1:
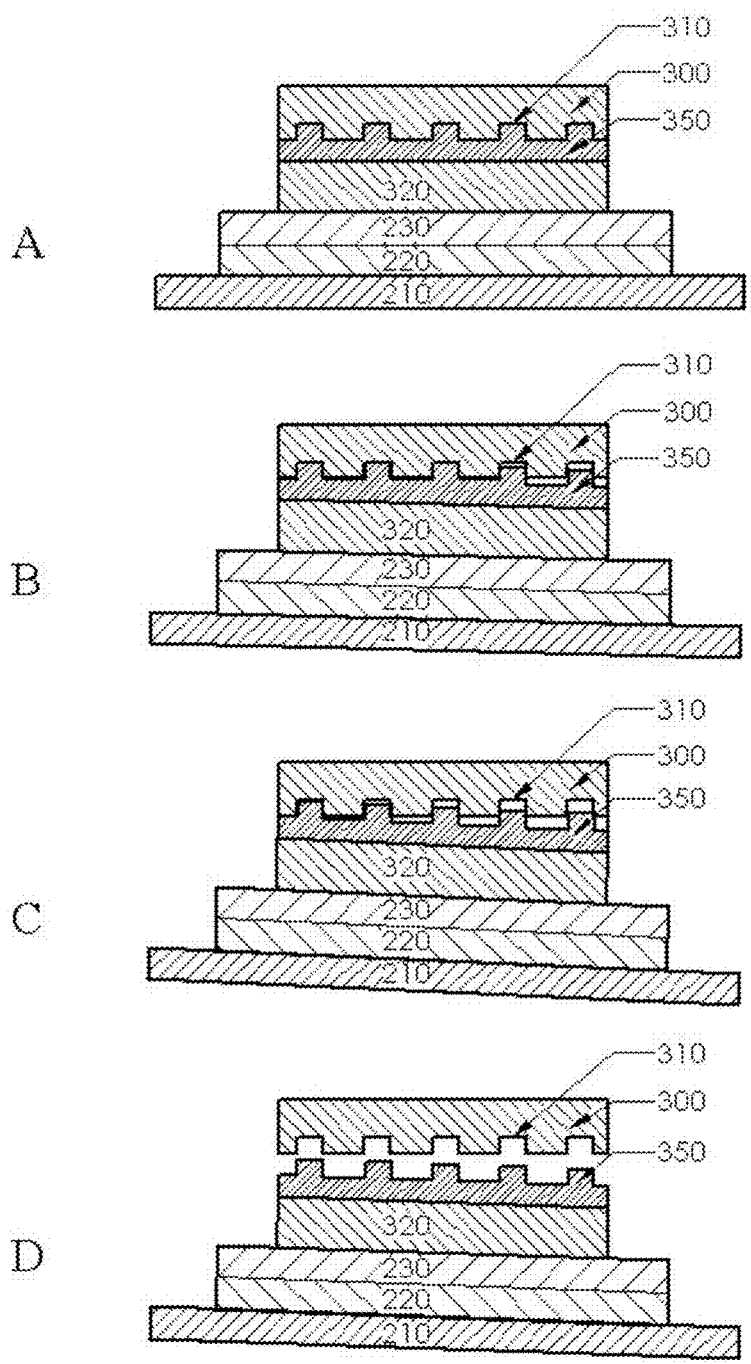
FIG. 1 is schematic drawing of the system illustrating one exemplary embodiment.

It is to be understood that these drawings are for purposes of illustrating the concept of the invention and are not to scale.

It should be understood that throughout the drawings, corresponding reference numerals indicate like or corresponding parts and features.

DETAILED DESCRIPTION

The following description is merely exemplary in nature and is not intended to limit the present disclosure or the disclosure's applications or uses.

The descriptions assume that UV curable imprint is conducted if it is not clearly identified and UV curable imprint is used as example. However, the invention does not limit for UV curable imprint and also apply for thermo-plastic imprint. An ordinary skilled in the art that is familiar with nanoimprint technology can easily revise the embodiment described in the invention to implement the concept of the invention for all type of imprinting.

The overall separation process of the system is illustrated in FIG. 1. The invention described method of separate mold and substrate after imprint by generating a controlled relative movement between them. The relative movement may be the peeling: either peeling substrate from mold, or peeling mold from substrate, while controlling the peeling direction and peeling speed. Even thick mold/substrate with hard materials can be separated after imprint under the process.

Figure 2:
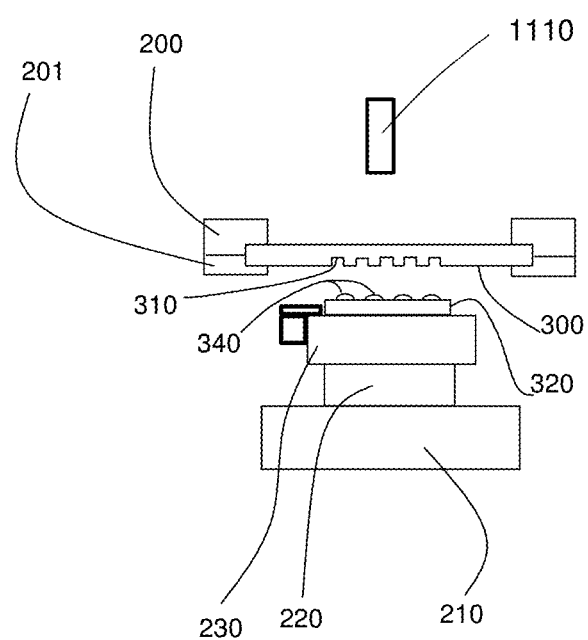
FIG. 2 is a schematic drawing illustrating the process chamber.

In accordance with the concept of the invention, referring to FIG. 2, the relative movement may be generated by motion stages. An imprint system compatible with the peeling process using motion stages includes a minimum of two axis stage (Z-Pitch or Z-Roll), preferable three axis (Z-Pitch-Roll). The complete system is controlled by control system and PCs. A mold 300 for imprinting is held against a mold holder 200 by using vacuum or other mechanical clamp means. The mold holder is hollow to permit a central patterned region 310 of mold 300 to be freely accessible from underneath side, top side or both sides. The surfaces in contact with the mold on the mold holder 200 are designed and specially polished, which can hold the mold with a minimum deformation. A stage assembly 210 is mounted onto the bottom. The stage assembly 210 contains X-Y-Z-Yaw (θ)-Pitch-Roll six degree motion controls for many purposes: first, the multi-axis motion of 210 may provide adjustment to make the surface of substrate 320 parallel to the patterned surface of the mold 300. Second, the multi-axis motion of 210 may be used to move the substrate 320 to align with the mold 300. Third, the multi-axis stage may be used to bring the substrate 320 to contact with the mold 300 before imprint. Last, the multi-axis stage 210 may be used to separate the substrate 320 from mold 300 after imprint. An optional overhead camera 1110 is used to observe the separation boundary between the separated and un-separated area between the mold and substrate.

A chuck 230 with vacuum grooves on its top surface is mounted on a force sensing apparatus 220 which in turn is mounted on the stage assembly 210. A substrate 300 for imprinting is held on chuck 230 by vacuum pumping through the vacuum grooves. Additionally, apparatus 225 is used to clamp the substrate long the plane X-Y by mechanical means. Surface of chuck 230 are designed and specially polished in order to hold the substrates with minimum deformation. The stage assembly is either mechanically installed or capable of moving the substrate within its X-Y travel ranges to superimpose the center of the substrate with the center of patterned region 310 in X-Y plane. The substrate may have a moldable material 340 applied on its side surface facing the mold before imprint begins. The moldable material could be a continuous film layer of imprinting resist spun on or a plurality of droplets of imprinting resist dispensed on. When the moldable material is in form of a plurality of droplets before imprinting, the distribution of the droplets could be a uniform matrix of equal spacing among adjacent droplets along one direction or multi directions, or an arbitrary matrix optimized for merging each to achieve desired imprinted patterns. In additional to these general demands for imprinting, the special distribution of droplets is preferred to deliver a uniform and continuous contacting interface between the mold and the substrate during the imprint process of the apparatus.

Figure 4A:
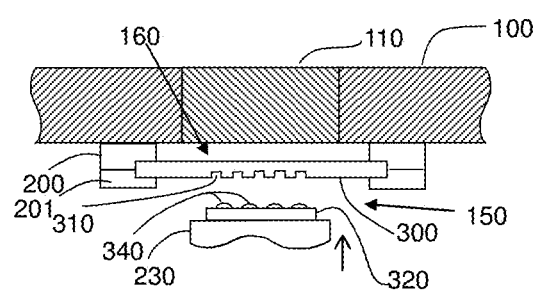
FIG. 4A-4D illustrates operation process of the apparatus illustrating one exemplary embodiment.

Referring to FIG. 4A, mold holder 200 with mold 300 installed is loaded into chamber 100 and firmly attached to top plate of the chamber wall by mechanical apparatus 201. Substrate 320 with moldable material 340 on its top surface is held against chuck 230 by pumping through the vacuum grooves and positioned beneath the opening of mold holder 200. At beginning of the imprint process of the apparatus, substrate 320 is positioned to a starting position which normally has a 1-2 millimeter gap between the substrate and the mold. Gap measuring sensors are used to detect mold and substrate gaps at 3 different locations. Then the substrate is adjusted by moving Pitch-Roll-Z stages of 210 until all the gaps are the same. This means the substrate surface is in parallel with the mold surface. Alternatively, the gap may be measured using microscopes and alignment marks on the mold and substrate. In addition, by observing the interference pattern between the mold and the substrate, the substrate surface may also be adjusted to be in parallel with the mold surface.

Next step of the imprint process is to pump chamber volume 150 and mold mini-chamber 160 to remove air. This pumping step facilitates to reduce trapped air defects of imprinted patterns. Alternatively, an extra pneumatic line is equipped with the machine which allows special gas with fast diffusion such as Helium to be used to facilitate the removal of air in the chamber.

Aligning the substrate with the mold can be finished before the pumping or in the pumping. Normally, aligning the substrate and the mold is accomplished by positioning an align marker on the substrate overlapping with a matching align marker on the mold under microscopes. To prevent possible shift of the substrate on chuck 230 during the pumping, both the substrate and mold are mechanically clamped in positions. By using the vertical microscope and alignment marks on the substrate and mold, the substrate is first moved to coarsely align with the mold. This will remove the small error generated during loading and machine assembling, and make sure the fine alignment marks on the mold and substrate are located in the same field of view, therefore no further searching of alignment marks necessary, significantly improving the alignment speed and reliability, which are required for manufacturing. Microscopes will then read mis-alignments at different locations by using the fine alignment marks. The finer X, Y, and rotation error can be corrected by substrate stages 210 and further by substrate stages 229.

Figure 4B:
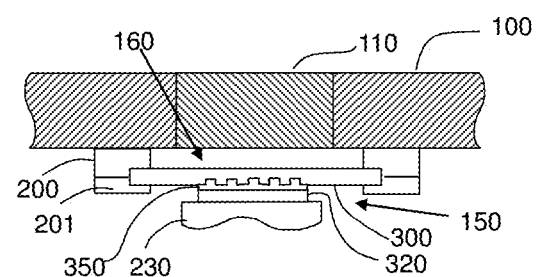

Referring to FIG. 4B, the substrate may be moved up to contact with the mold under a controlled push by the stage assembly. The substrate 320 surface to be patterned is adjusted in parallel with mold pattern surface by the leveling mechanism in the system before the final contact. Optical sensors (not shown) and force sensors 220 can be used to locate the exact contacting point and contact force. To accomplish the contact step, substrate 320 is moved up slowly until there is a slight controllable contact force between the mold and substrate reached. Final contact can be achieved either by continuing moving stages 210 or by releasing the mold from the mold holder. Fluid pressure imprint (ACP) and UV curing were then carried out.

Figure 3:
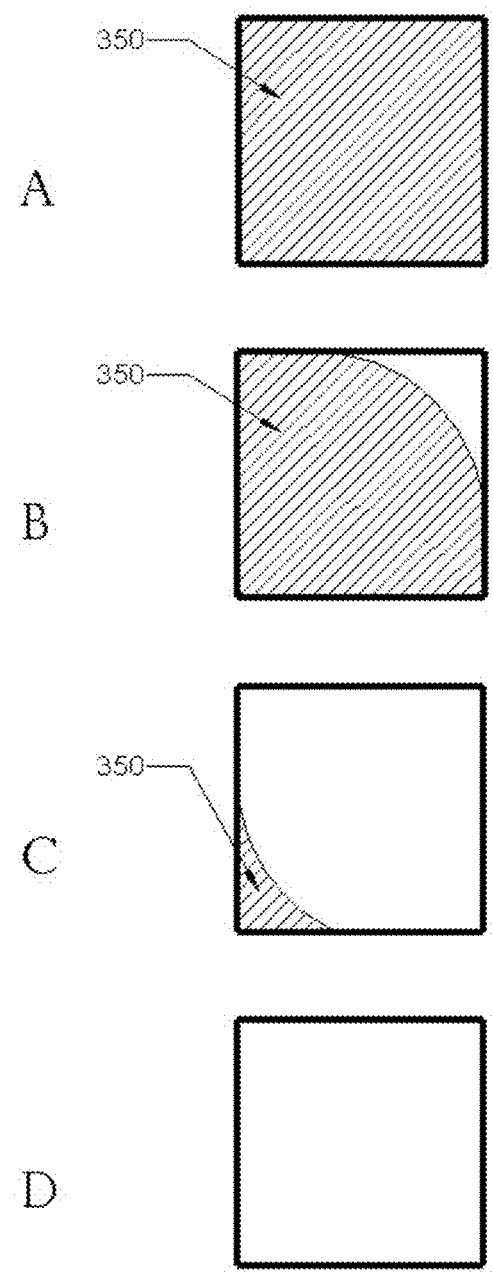
FIG. 3 is a top view schematic drawing of the imprinted area illustrating the separation process.
Figure 4C:
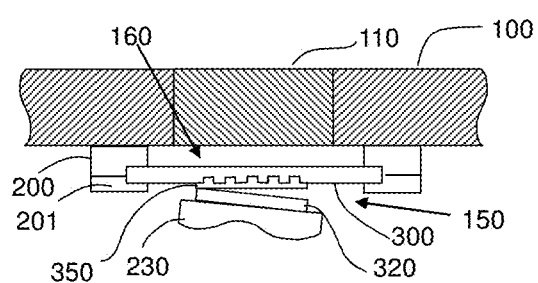
Figure 4D:
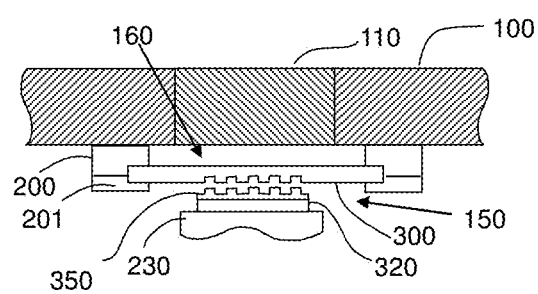

FIG. 4C illustrates the separation process where substrate is peeled off from the mold. FIG. 1 further illustrates this process in four detailed steps, while FIG. 3 illustrates top view of imprinted area for each step of the separation shown in FIG. 1. The methods of separation share a common concept that use either vacuum or other mechanic means to hold the mold and the substrate, and create a relative movement between mold and substrate for separation. Pull the mold/substrate in certain way using the stage assembly to create relative motion between the mold and substrate is one way to separate. The mold may or may not need to be intentionally deformed for the separation. Referring to step 501 of FIG. 5, first, pressures at both chamber and minichamber will be well controlled. In one example, this pressure is set to be the same atmosphere pressure. In one more example, the mini-chamber will have a slightly higher pressure than the chamber so the mold is bending towards the substrate. In yet another example, the mini-chamber will have a slightly lower pressure than the chamber so the mold is bending upwards away from the substrate. The separation then starts from vacuum holding back side of substrate 320 against top surface of chuck 230 by pumping through the vacuum grooves on the chuck, and at the same time holding mold 300 against surface of mold holder 200 by pumping through the vacuum grooves on the mold holder, as shown in step 502 of FIG. 5. If chuck 230 is away from the substrate, the chuck is positioned to contact back side of the substrate by the stage assembly prior to the vacuum holding.

Figure 5:
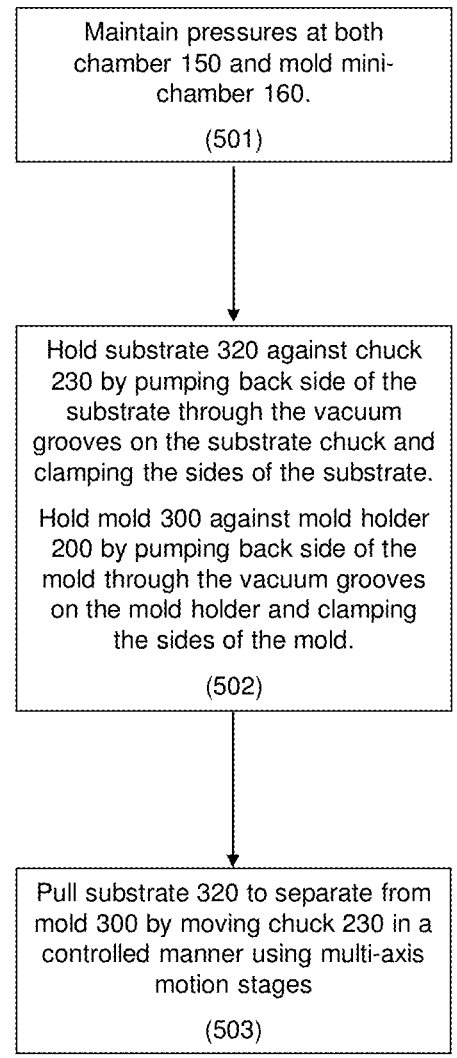
FIG. 5 is a flow chart to show steps of separation process.
Figure 6:
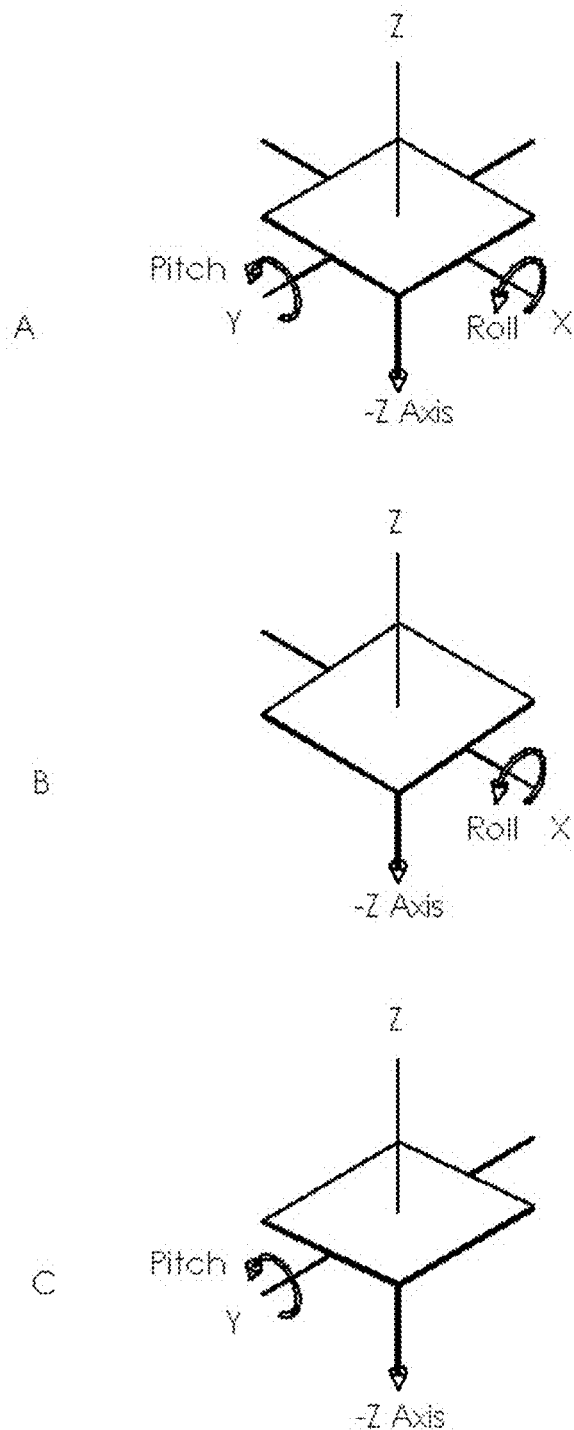
FIG. 6 is a schematic drawing illustrating the substrate surface during separation process.

Referring to step 503 of FIG. 5, to separate, Z-Pitch-Roll stages will pull substrate 320 away from the mold staring from one corner: this can be accomplished by moving Z down while moving the Pitch and Roll stages accordingly as shown in FIG. 6A. The purpose of this action is to control the behavior of separation to start from one corner of the imprinted area. Because both the substrate and mold are held against the vacuum grooves on the mold holder and chuck, at beginning of the pull, one corner of the imprinted area is separated first. Referring to FIG. 3, where the shaded area shows the resist 350 is still in contact with mold and substrate, and empty area shows the mold is already separated from the substrate. The boundary between them is called the separation front line. As the downward pulling is progressing, the separated region of the substrate propagates from the firstly separated corner inner ward the center. At end of the downward pulling, the substrate is completely separated from the mold as shown in D of FIG. 3. The speeds, acceleration, deceleration of the Z-Pitch-Roll stages can be independently fine adjusted to control how fast and the direction the separation propagates. Thus, the reliability of separation is significantly improved with the critical dimension of fine nano-scale patterns in the imprint process maintained. As force sensors are directly mounted between the stage 210 and the chuck 230, separation force can be monitored and controlled. The other advantage of current system is it allows user to measure the separation force of different resists therefore fine turning their process parameters for manufacturing. Alternatively, the separation motion of the substrate can be much more complex than a simple downward diagonal pulling motion to best separate the substrate from the mold, reducing the possible damage to nano-scale patterns and improving separation speed. The stage holding the substrate in the system is capable of multi-axis motion movements, therefore the substrate can move with its motion and speed accurately controlled. The separation may include movements of multiple steps with the speed and direction of each movement be controlled. In one more example, the substrate moves down in Z while going through Roll motion, as shown in FIG. 6B. In another example, the substrate moves down in Z while going through Pitch motion, as shown in FIG. 6C. The motion shown may also be combined to create more sophisticated motion profile. In yet another example, the separation includes 2 step movements: first the substrate moves down in Z while going through Roll motion, and then it moves down in Z going through Pitch motion. In fact, any combination of the stages movements and movement sequence, which helps the separation front line to propagate, may help the separation and end up separating mold/substrate. A simple preferable way of separation is by moving stages Z-Pitch-Roll to have a diagonal separation front movement. But using Z-Pitch or Z-Roll to generate a separation front along the substrate direction (X or Y) may also be acceptable. A combination using Z-Pitch first then Z-Roll, or vice versa, may also work. During separation, the speed of the relative movement between mold and substrate can be set to 0, meaning both mold and substrate can stop at a certain position. This happens when during separation, we hold and wait for the separation front line to propagate.

Another advantage of proposed method is the mold used for the apparatus may or may not need to be deformable under a reasonable differential pressure between its two sides. The mold could be made of quartz, glass, polymer, semiconductor, metal or a mixture of some of the above materials regardless of the thickness. One example of the molds uses 150 mm by 150 mm quartz substrate with a thickness of 6.35 mm; One example of the molds uses 200 mm diameter Silicon substrate with a thickness of 0.1-2 mm; yet one more example of the molds uses 8" diameter quartz or glass wafer with a substrate thickness of 0.2-1 mm; another example of the mold uses 12" diameter quartz or glass wafer with a substrate thickness of 0.2-2 mm; one more example of the mold uses 8" diameter Ni substrate with a thickness of 0.1-1 mm.

Yet another advantage of the method is there is no requirement on the relative sizes and thickness of the mold and substrate. The mold can be bigger, smaller, or the same size as the substrate. There is no requirement on their respective thickness as well.

One more advantage of the method is it does not require the pressure difference for separation. Therefore it is not necessary to have a chamber. The chamber in the invention is only used for imprint purpose.

The relative movement for separation may also be generated by springs, stage driven flexures, inflatable O-rings and other mechanical means. The relative movement may also be generated by gas flow. When one corner of the mold/substrate is started to separate, gas flow can be introduced in between mold/substrate, preferably vertical to the direction of separation front. The flow rate and gas pressure can be controlled for best result. A mixture of above methods will work. For example, an inflatable O-ring (in the mold holder, mold, or substrate holder) may push locally the corner of the imprinted die to create an initial separation. Then an air flow, preferably vertical to the separation front line, can be used to assist the propagation of the separation.

The current method is also capable of telling when the separation is finished. The separation completion may be detected by vacuum of system and mold/substrate holders: for example, when vacuum levels of mold/substrate holders suddenly get better, it typically means a separation. The separation may also be detected by the recorded force during separation. It may also be detected by processing the camera images from top view of the die area and locating the separation front line. A combination of these methods will give reliable indication of the separation.

Figure 7:
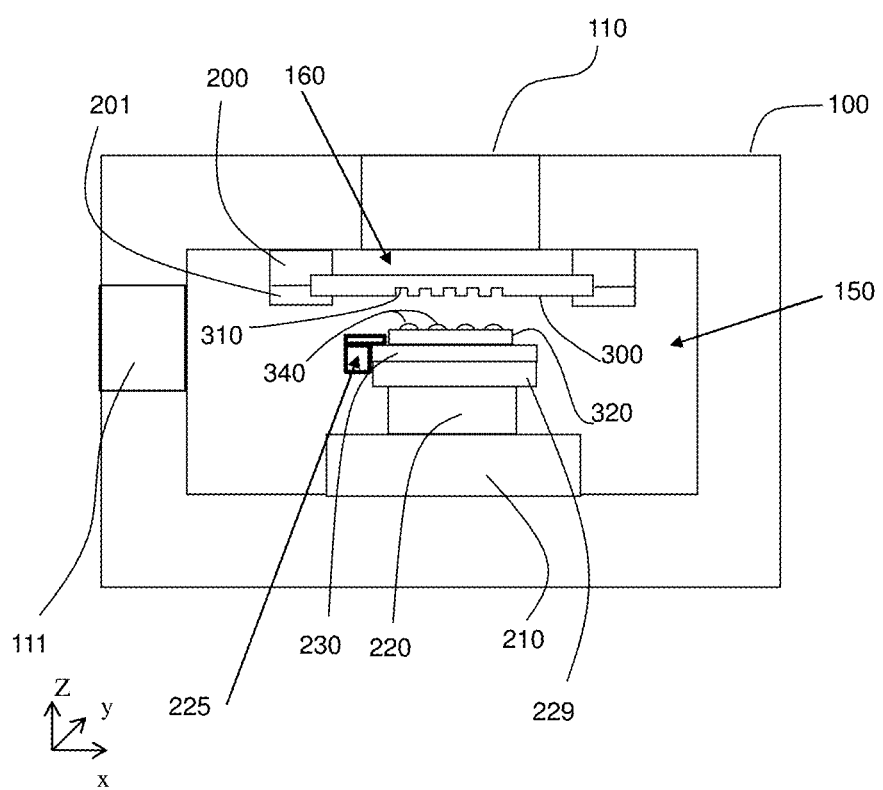
FIG. 7 is a schematic drawing illustrating the process chamber with ultrafine multi-axis stages.

Referring to FIG. 7, to further improve the performance of the separation, higher resolution (nano-scale accuracy) multi-axis stages 229 may be installed in the system, between substrate chuck 230 and force sensing apparatus 220. Stages 229 serves two purposes: first, they can move the substrate to achieve ultrafine alignment to the mold, which are required for manufacturing by many applications; second, they provide extra fine movement for the separation process. Different type of stages may be used, including piezo stages, linear stages, etc. Chamber 100 is not needed for this purpose.

The system described here also has an additional function: it is capable of separating the mold from substrate by deforming the mold, as described in U.S. patent application Ser. No. 13/011,844. This separation method may be combined with the stage peeling method to further facilitate the separation process. With a chamber existing, current system structure also allows for the automatic robotic arms to load the mold into the chamber, and unload the mold from the chamber, something difficult in previous patent application. Therefore we are proposing an imprint system capable of bending mold for separation, peel substrate for separation, and a mixture of both. The chamber, the mini-chamber and the substrate chuck are all fluid connected to separated gas lines, so their pressure and vacuum, and gas flow may be well individually controlled. There is a high pressure gas reservoir, regulators, vacuum pump source, manifold as well used in the system.

The improvements possessed by the invention are emphasized again herein. The apparatus embodiments described in the invention accomplish a full cycle of imprinting inside the chamber through a process essentially involving separating the substrate from mold after imprint by the stage assembly. The speed to finish separation process is primarily decided by stage response. Using state-of-art stage technology, stage response can be very fast and capable of responding to requests in milliseconds. Furthermore, the method is compatible with the advantageous Air Cushion Press (ACP), which provides very uniform imprinting force crucial to achieve the pattern fidelity required by manufacturing.

It is to be understood that the above described embodiments are illustrative of only a few of the many embodiments that can represent applications of the invention. Numerous and varied other arrangements can be made by those skilled in the art without departing from the spirit and scope of the invention.

Figure 8:
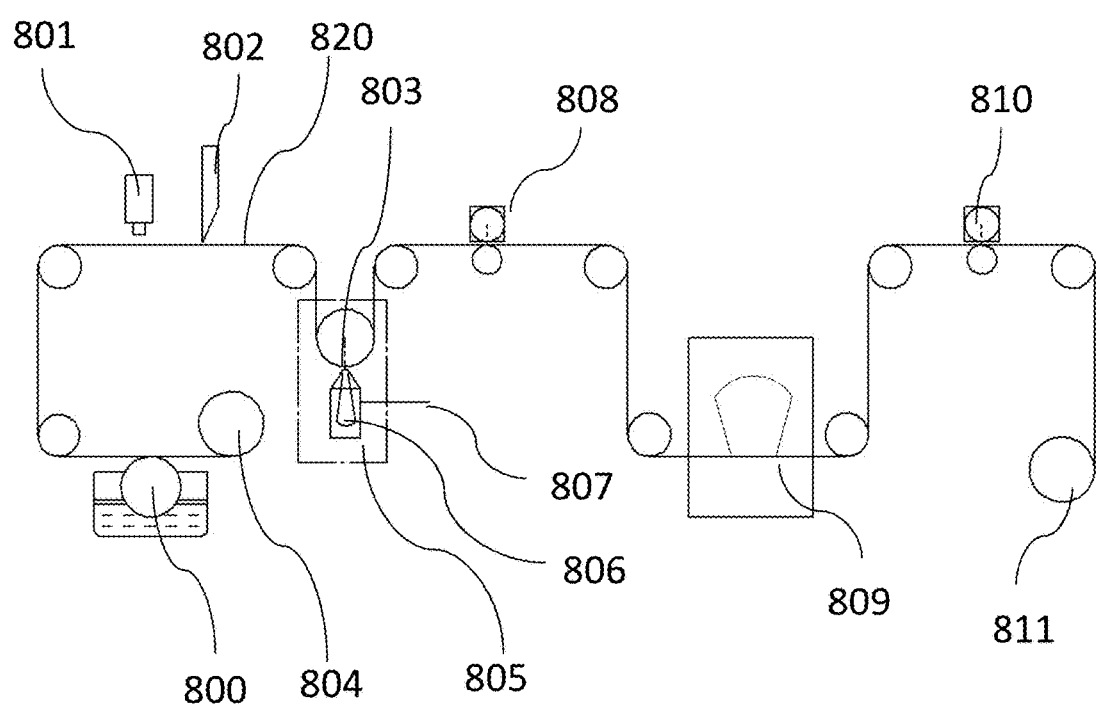
FIG. 8 is schematic drawing showing a typically roller imprint system.

In accordance with the concept of the invention, referring to FIG. 8, the roller imprint system has at least two modular sections: one for resist application, including 800, 801, 802 and rollers for directing directions, one for imprint, including 803, 805, 806, and 807. Alternatively, the substrate may directly pass through the material path where the material is deposited on its surface. Extra section may be added between 800 and 804 to allow the substrate to pass through, where a chemical vapor is deposited on the surface of the substrate. This may be accomplished by a small chamber where the chemical is heated. Unwinding roller 804 and rewinding roller 811 are located on the two ends of the system. Base pressure adjuster 808 and 810 are located at different sections of the system to control the base contract pressure. Optionally additional process sections may be inserted after imprint section: for example, a metal coating section 809 may be inserted. Alternatively the coating may also be carried out using vapor treatment. In addition, contact force sensors are installed in the system close to the roller belt to sense the base pressure of the press.

In the resist deposition section, different ways can be used to coat the substrate. The first method is to use a roller 800 to pick up resists from a reservoir. By rotating and contacting the roller with the substrate 820, resists can be transferred to the substrate. To further control the thickness and uniformity of the resist, a resist thickness controller 802 maybe used before imprint. Resist may also be dispensed on the substrate using a dispenser head 801. Typically a low viscosity resist (0.1-200 cP) may be used. The nozzle can be moved to have a gap of 0.1 mm-25 mm to the substrate for dispensing. Typical resist droplets have a volume of 1-100 pL. By using a dispensing head with multiple nozzles (16-256), and firing of droplets at >10 KHz, the droplets can be coated on the substrate on the fly, satisfying the high speed of roller imprint. As the width of the dispenser head is from 1"-4", substrate with width wider than 4" would need multiple heads. The firing frequency f (Hz) of the dispenser head and the moving speed v (m/s) of the roller substrate will determine the gap between droplets along substrate moving direction to be: $v/f*1e6$ (µm). To further assist the resist stickiness with the substrate, surface surfactant may be applied to the substrate before the coating. This can be easily done by a vapor treatment of the substrate. A heated surfactant reservoir is typically placed underneath the moving substrate for coating. The same vapor treatment method can also be used to coat the mold.

In the imprint section, substrate will be in contact with the mold 803. The base contact may be adjusted by a sensor and tightening adjustor 808. The fluid pressure can be applied by an Air Cushion Press (ACP) head 807. The ACP head can be placed very close to the imprinting roller where a very thin line of resists will be further imprinted by fluid pressure and then cured.

Various flexible materials may be used as the substrate or mold, organic materials including PET, ETFE, PVC, by way of example, may be used. Low tensile strength and high elongation are the general properties to look for while searching for new materials.

Figure 9:
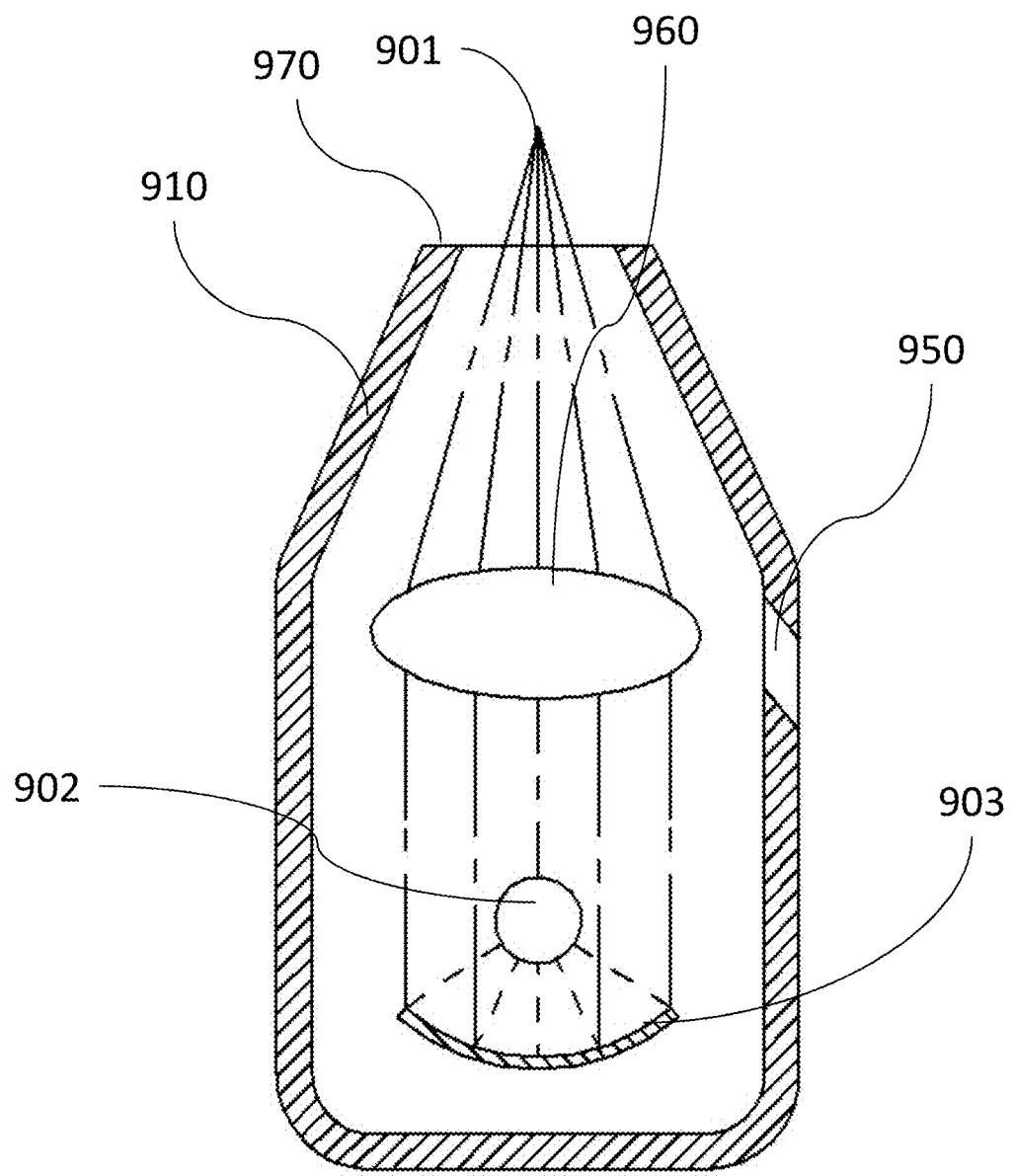
FIG. 9 is a schematic drawing illustrating the air cushion press head integrated with the UV/Thermal heating source.

Referring to FIG. 9, which shows a detailed schematic of the special designed integrated ACP head and light source. The head has an outside wall 910, gas inlet 950 at the wider end, and an opening output end where the head is getting much narrower. This works as an air knife to generate a much higher pressure at the output end. Inside the head, a UV light source 902 may be placed to generate UV light for exposure. The source is placed on the focus point of a reflective mirror at the back of the head. The light will reflect and then be bent at the lens 960 with its beam direction at the output end adjusted. By changing the optics inside, the distance from output beam focus points 901 to the head output plane 970 may be adjusted. Due to the nature of gas pressure, the head is capable of uniformly imprint a rectangular area which may have the same width as the substrate, and a length range of 0.05-1 mm. A thermal heat source may also be placed inside to replace the UV light. It is also possible to place both thermal and UV sources inside. In the imprint process, they can run simultaneously or one after another.

The wavelength of UV is typically between 180-410 nm. Narrow band filters may be used in the light path to limit the wavelength. ~365 nm light may be used for exposure. In addition, UV LED light source may also be used. It typically has a central wavelength of 365 nm or 400 nm. It has a long lifetime, constant power density, and can instantly be turned on and off.

If thermal heating source is to be used, the ACP head may need to be cooled, preferably by cooling water around the outside surface 910 of the head.

During imprint, the ACP head will be placed in close proximity to the substrate to be imprinted, at a preferred distance ranging from 0.001-5 mm. The pressure applied depends on the distance, and the input pressure. The system use high pressure reservoir, regulators, gas lines and vacuum to control the pressure. There will be a PC to drive all the control electronics to move the rollers at controlled speed, and control each section of the system to finish the imprint work and unwinding/winding. Sensors are mounted at different locations of the system to tell the pressures, the gap between parts etc. The rollers have a typical size of ~1 inch diameter, although some individual rollers (including roller to mount mold or substrate) may have quite different sizes.

FIG. 10-15 shows ACP roller system designs for six types of roller imprint systems (include rigid mold, flexible mold, roller mold on either rigid substrate or flexible substrate) by using above ACP head or a chamber. They all have similar PC control, electronics driving, roller unwinding/winding, sensors, pressure reservoir, pressure control, gap control, with similar roller sizes. Some of the system can have roller/substrate moving continuously, while others may go through a move, then imprint cycle.

Figure 10:
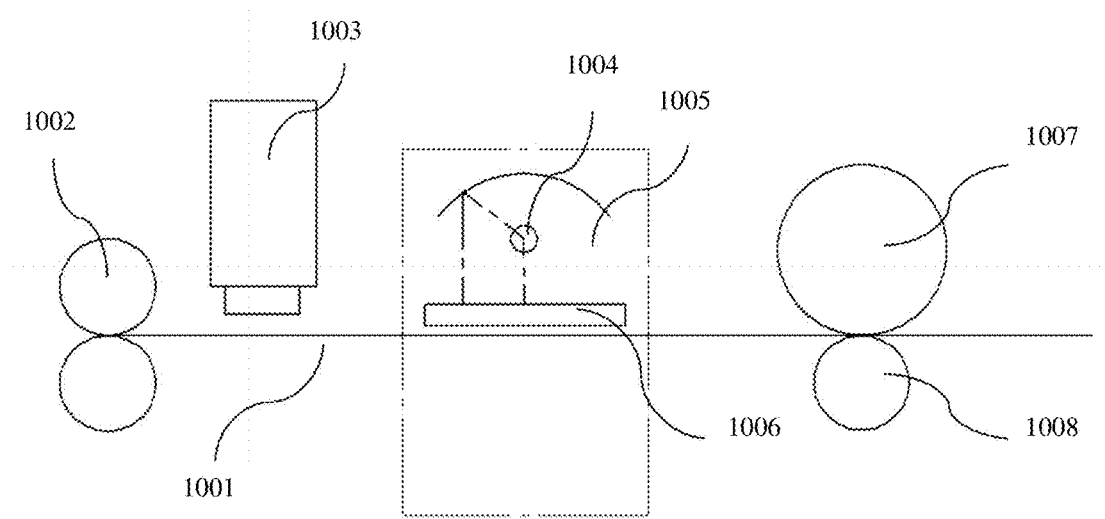
FIG. 10 illustrates a roller system using air cushion press for imprint rigid mold on flexible substrate.

FIG. 10 shows roller ACP setup for imprinting a rigid mold and flexible substrate. The substrate is first passing a material flattening roller set 1002. The resist will be dispensed on the surface of flexible substrate 1001. The flexible substrate is then moved into a chamber 1005 where vacuum and pressure can be applied. The rigid mold 1006 is pressed against the flexible substrate inside chamber 1005 by air pressure and then curing. By peeling the mold from the substrate after imprint, the separation can be completed. This method may also be used to fabricate flexible mold.

Figure 11:
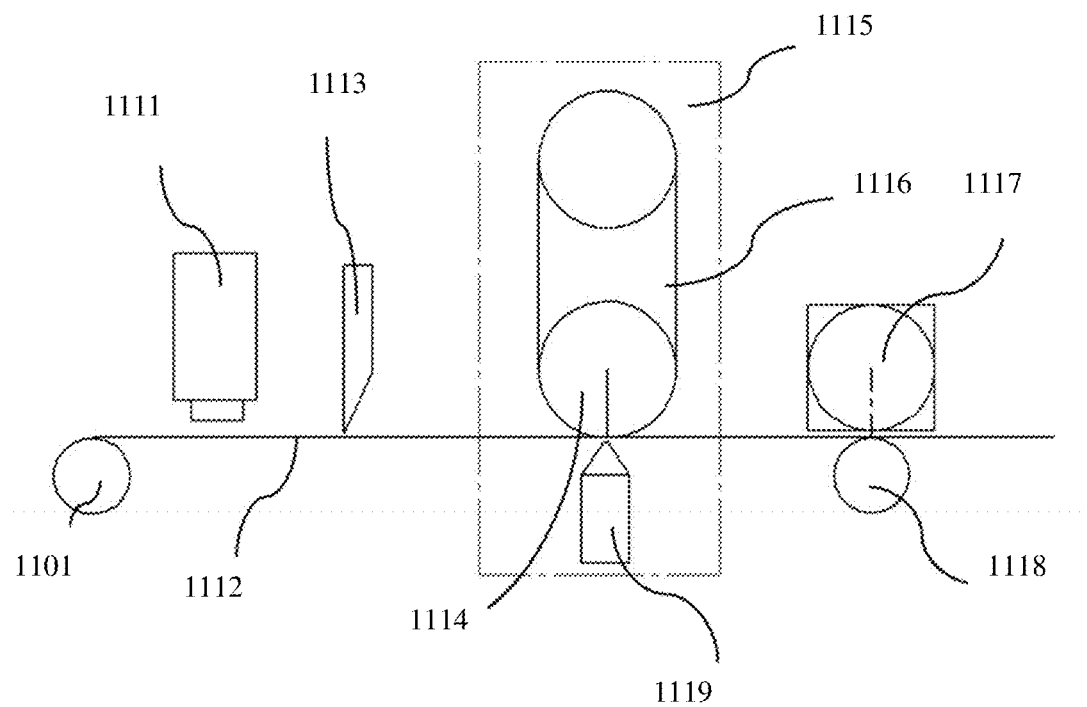
FIG. 11 illustrates a roller system using air cushion press for imprint flexible mold on flexible substrate.

FIG. 11 shows roller ACP setup for imprinting flexible mold on flexible substrates. The flexible mold 1116 and two rollers may be arranged vertically. ACP head 1119 is placed on a place where the mold is in contact with the substrate 1112. Alternatively, the two rollers may also be arranged horizontally with them at the same height. Again, the system has moldable material dispensing head 1111 and the moldable material thickness control 1113.

Figure 12:
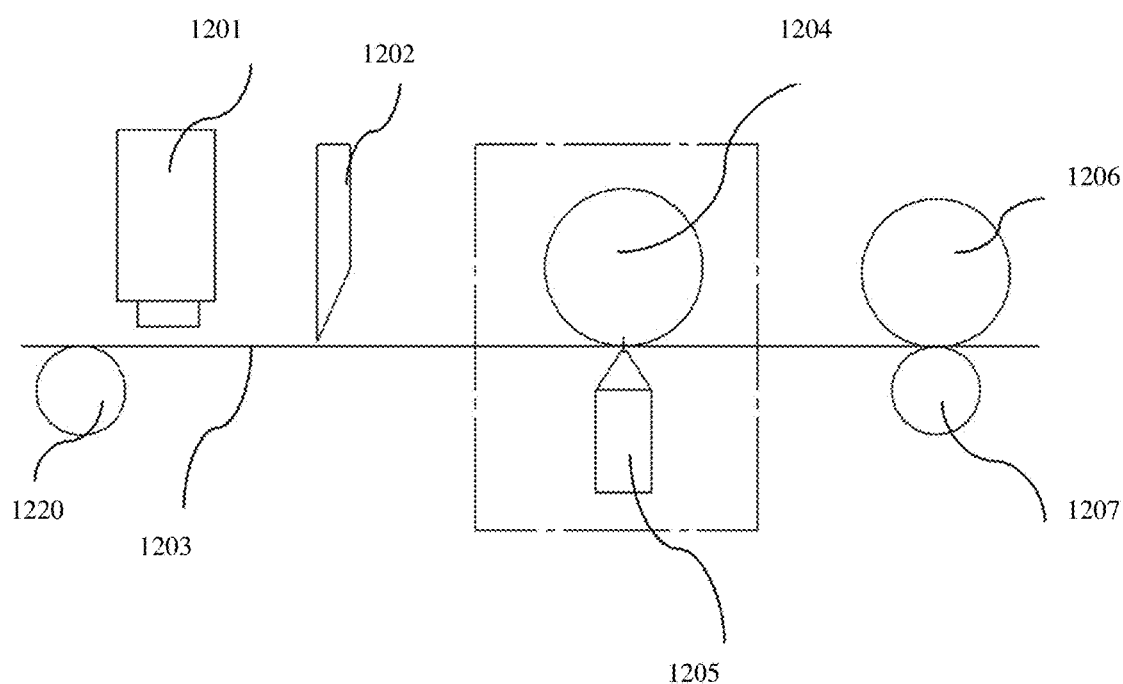
FIG. 12 illustrates a roller system using air cushion press for imprint roller mold on rigid substrate.

FIG. 12 shows roller ACP setup for imprinting roller mold on rigid substrates. Again, the ACP head 1205 is placed on a place where the roller mold 1204 is in contact with the substrate 1203. Push roller set 1206 and 1207 will drive the substrate with given speed.

Figure 13:
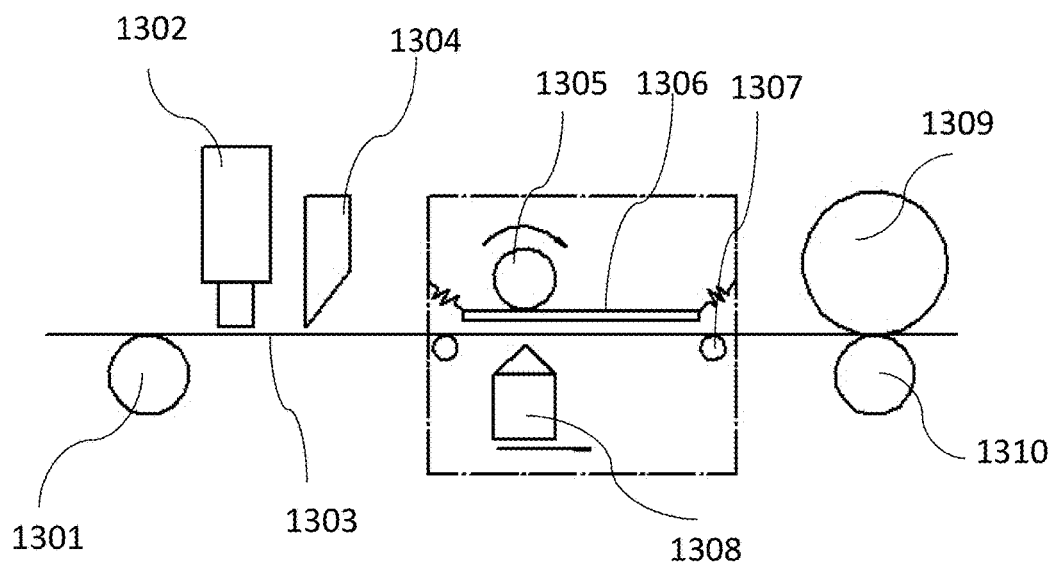
FIG. 13 illustrates a roller system using air cushion press for imprint rigid mold on rigid substrate.

FIG. 13 shows roller ACP setup for imprinting rigid mold on rigid substrates. The roller 1305 and ACP head 1308 are aligned first, and then move in the same direction with their movement synced to give a uniform imprint. Two rollers 1307 were used as substrate 1303 support while the mold 1306 is spring loaded for easy separation. The setup will be able to imprint a die section with the same size as the mold, and then move substrate to the next section for next die.

Therefore the roller system movement is no longer continuous; instead, it will go through a move, stop (imprint) cycle.

Figure 14:
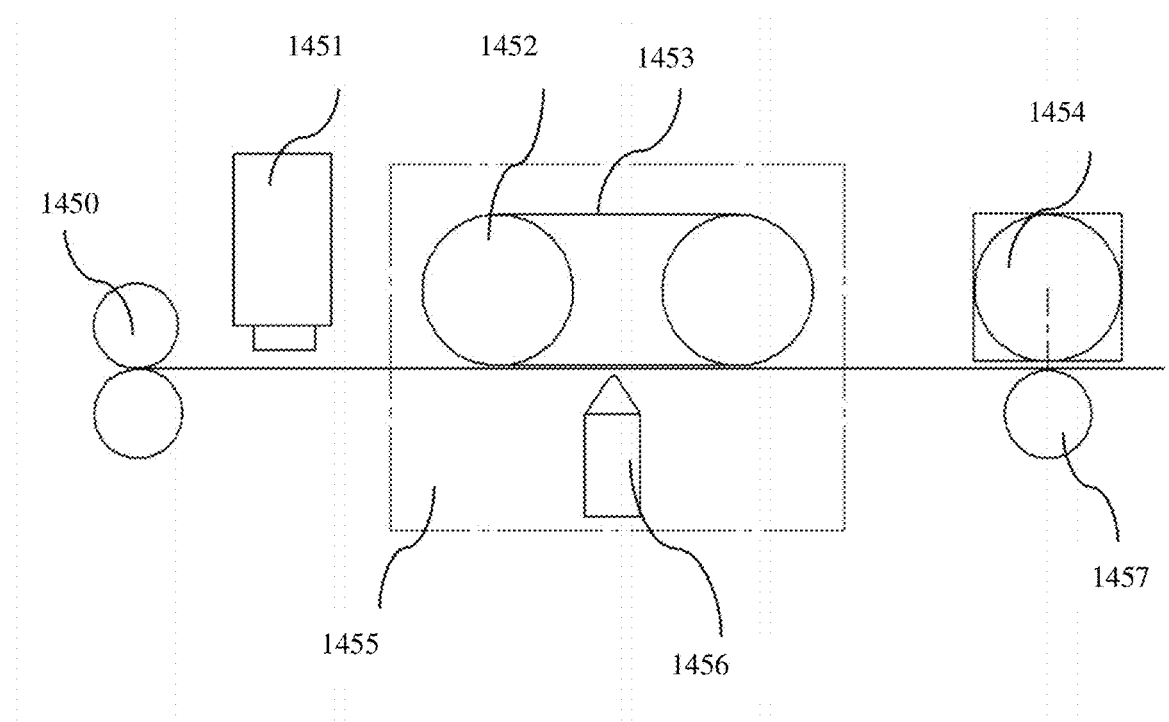
FIG. 14 illustrates a roller system using air cushion press for imprint flexible mold on rigid substrate.

FIG. 14 shows roller ACP setup for imprinting flexible mold on rigid substrates. Two rollers 1452 will rotate to move the flexible mold 1453 while the ACP head 1456 is placed in the middle for further imprinting as the substrate is moving.

Figure 15:
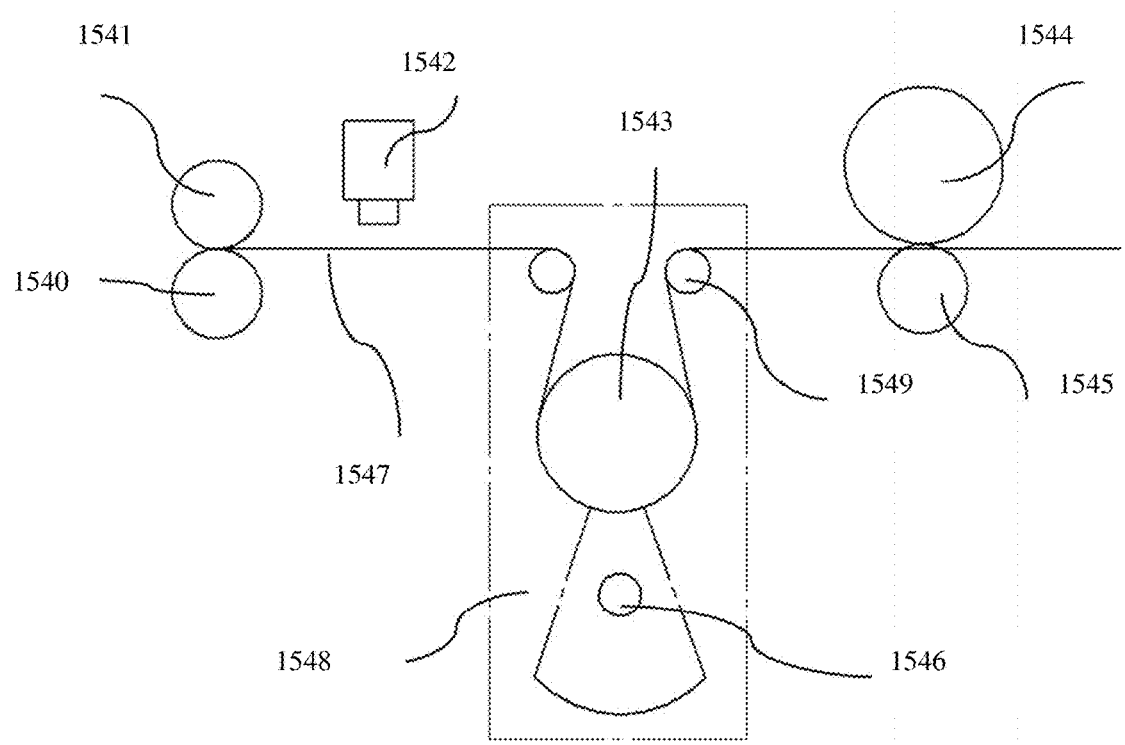
FIG. 15 illustrates a roller system using air cushion press for imprint roller mold on flexible substrate.

FIG. 15 shows roller ACP setup for imprinting roller mold on flexible substrates 1547. Again, the ACP head 1548 is placed in center where the roller mold 1543 is in contact with the substrate.

Fabricating roller mold is as important as roller imprint system. Without the roller mold, advantage of roller imprint will be greatly limited. FIG. 9-13 demonstrated five different methods of patterning a roller mold with microscale and nanoscale features.

Figure 16:
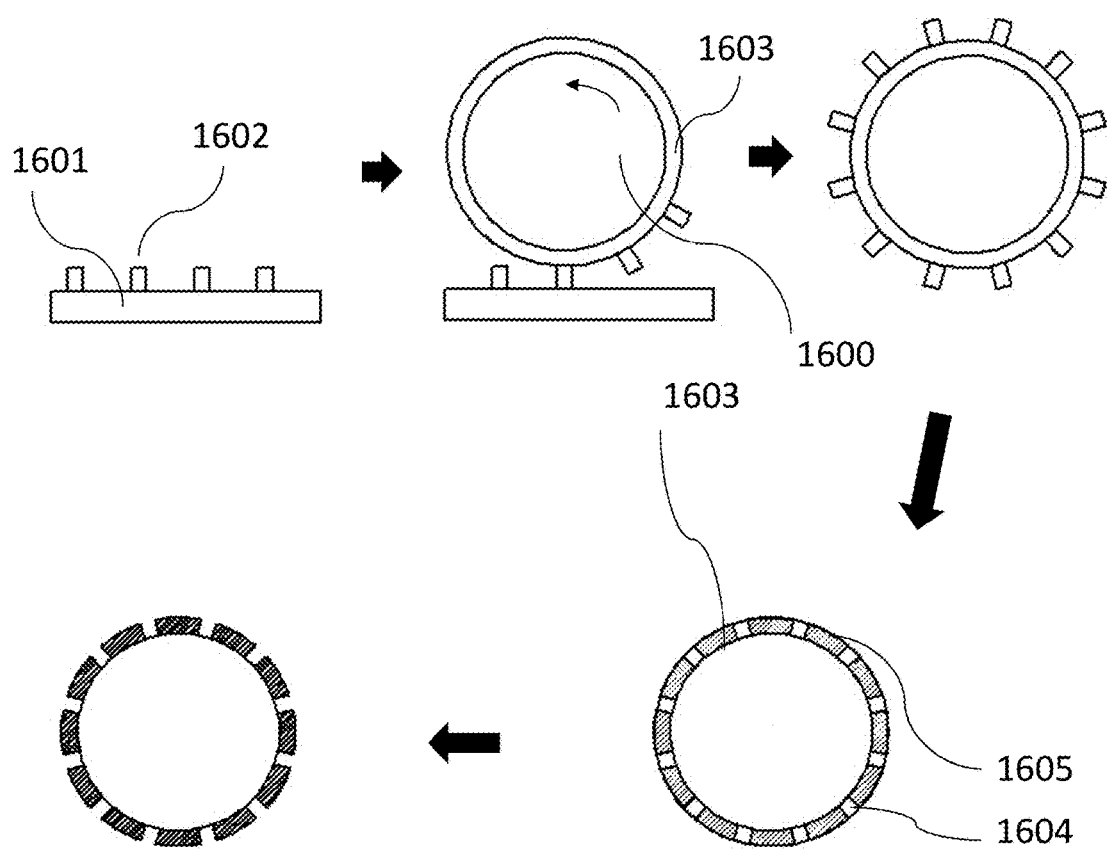
FIG. 16 illustrates the process of using plating to make a roller mold with microscale and nanoscale patterns.

FIG. 16 shows the first proposed approach for making patterns on a metal roller 1600. The process starts with generating a resist pattern 1602 on a substrate 1601. To help promoting the pattern transfer, a sticking layer 1603 is first applied to the metal roller surface either by vapor or by dipping. Then the roller is rotated on the substrate to transfer the pattern from the substrate to the roller. The sticking layer is then removed to exposure the metal surface. After that, plating is carried out using the metal roller. Roller is then rotated to polish the surface to be smooth, and the resist remaining 1604 is exposed outside. Finally the resist and the sticking layer underneath it are removed leaving metal patterns 1605 on the roller surface.

Figure 17:
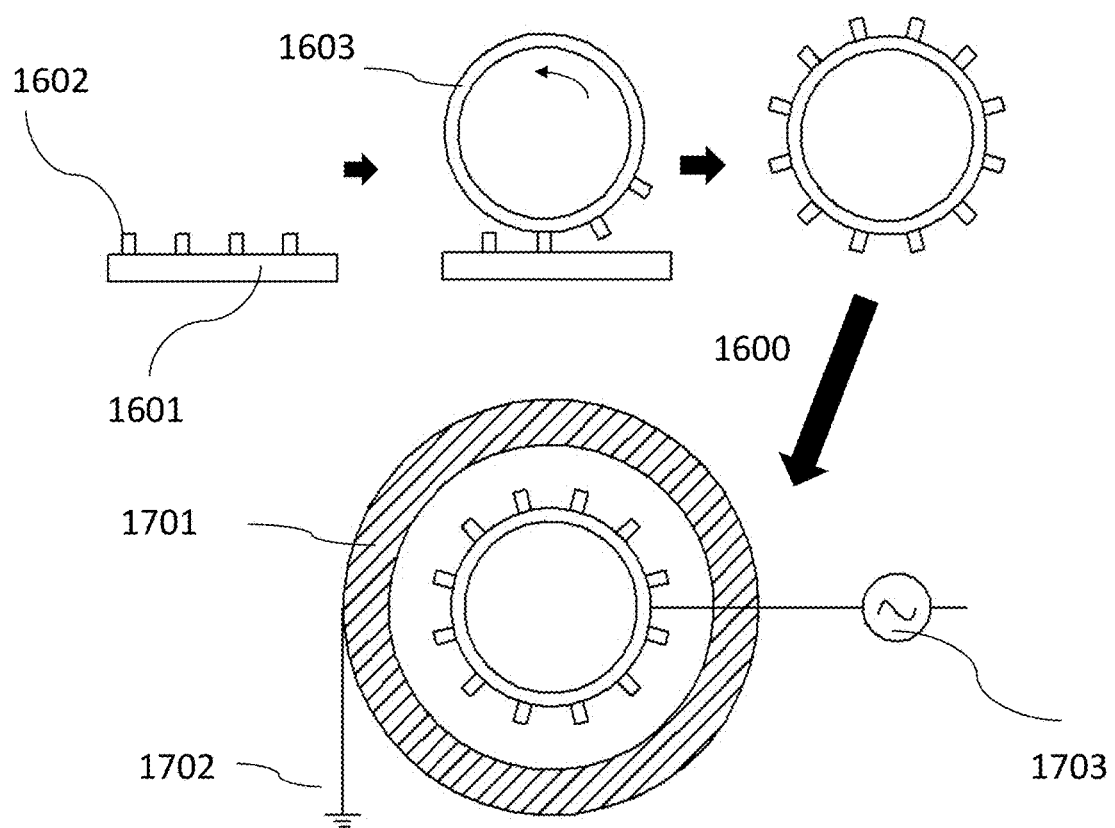
FIG. 17 illustrates the process of using a special RIE to make a roller mold with microscale and nanoscale patterns.

FIG. 17 shows the second approach for making patterns on a metal roller. The process starts with generating a resist pattern 1602 on a substrate 1601. To help promoting the pattern transfer, a sticking layer 1603 is first applied to the metal roller surface either by vapor or by dipping. Then the roller is rotated on the substrate to transfer the pattern from the substrate to the roller. After that, the roller is placed into a RIE chamber 1701 with metal roller being one of the electrodes for RF. The other electrode is chamber, which is grounded. RF power 1703 is applied where different gases may be introduced into the RIE chamber for dry etching to remove surfactant first and then etch pattern into the roller.

Figure 18:
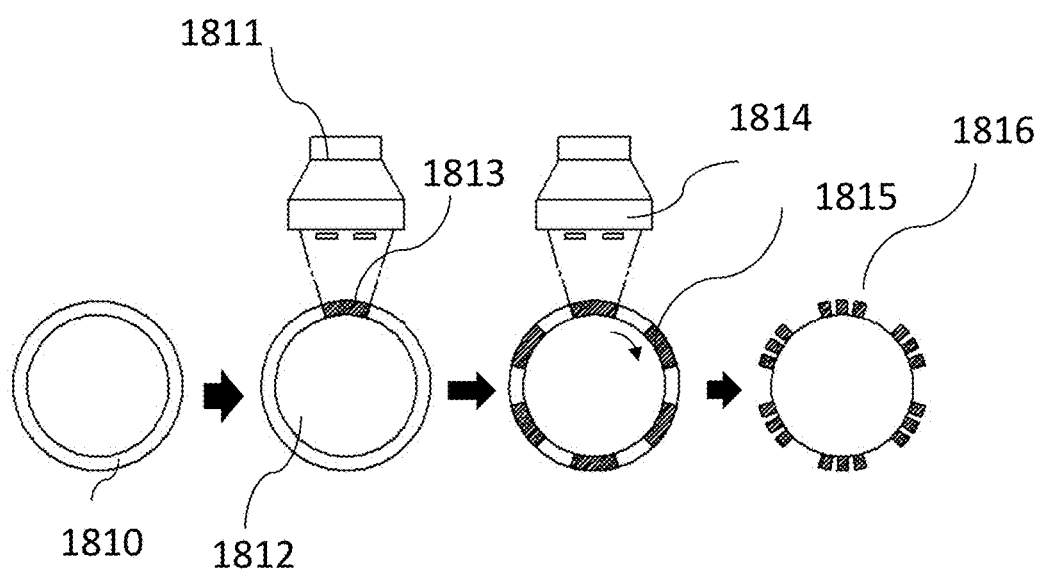
FIG. 18 illustrates the process of using projection optics exposure to make a roller mold with microscale and nanoscale patterns.

FIG. 18 shows the third approach for making pattern on a roller. Photoresist 1810 is first coated on the roller 1812. Then traditional projection optics 1811 with a photo mask 1814 is used to exposure a section of the photoresist 1813. To get nano-scale patterns, deep UV wavelength with high NA lens need to be selected. If the roller diameter is big enough, and exposure section is small enough, the focus depth of the optics will be larger than that of the difference of resist to photo mask distance due to the roller surface curvature. By rotating the roller, all the roller surrounding area can be UV exposed die by die. After develop, the pattern will be left on the photoresists. Dry etch (as shown in FIG. 17) or a wet etch process can follow to etch the pattern into roller.

Figure 19:
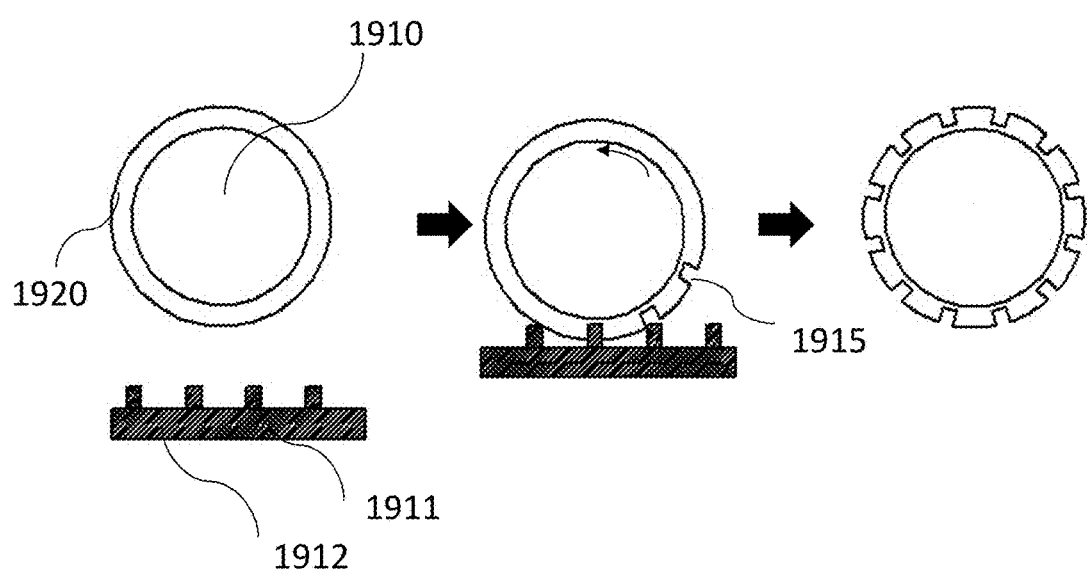
FIG. 19 illustrates the process of using cured resists to make a roller mold with microscale and nanoscale patterns.

FIG. 19 starts with making a traditional flat mold 1912 with patterns 1911. A roller 1910 is coated with moldable material 1920. Then the roller is rotated on the mold for imprint. The resist will be cured while imprinting. Due to the strong strength and low surface energy of the resist, it can be directly used as the mold material for further roller imprint.

Figure 20:
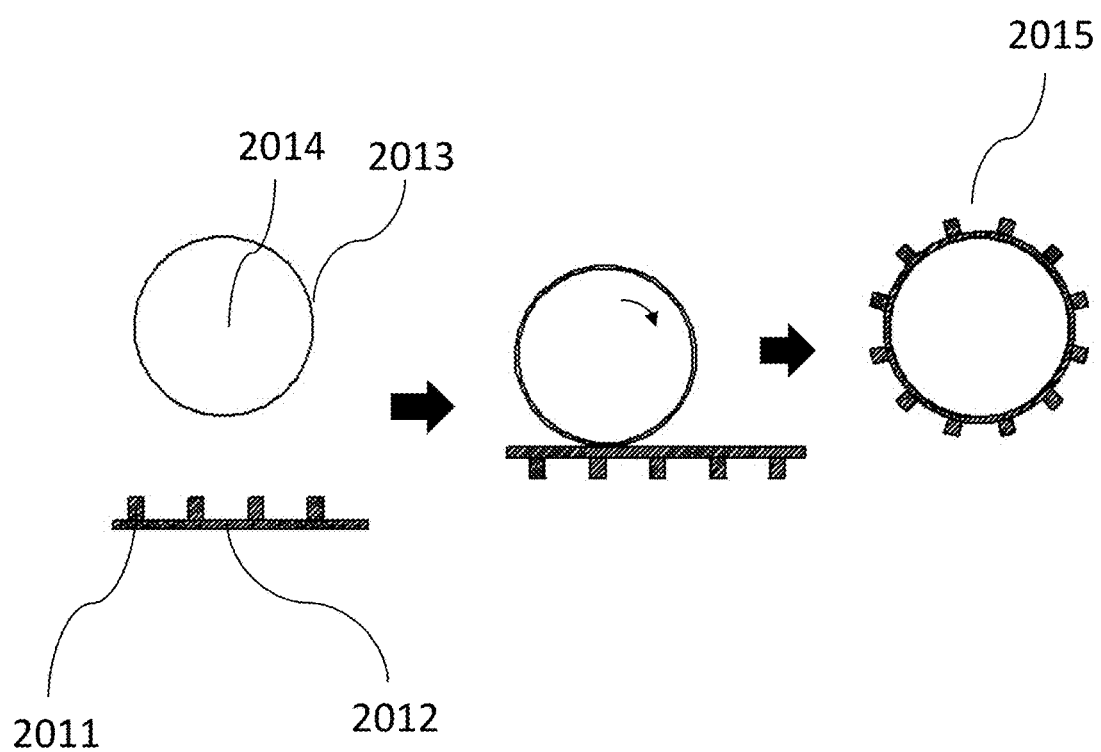
FIG. 20 illustrates the process of using thin flexible Ni to make a roller mold with microscale and nanoscale patterns.

FIG. 20 starts with make a thin and flexible mold with patterns. It can be a Ni mold (thickness less than 1 mm) or any other flexible materials including PET, PVC, etc. Then a layer of magnetic material or sticking material is coated around the roller. By rotating the roller on the back of the flexible material, the material will be either attracted or glued and bend around the roller due to the magnetic force or sticking force. The width of the flexible mold needs to be smaller than the width of the roller, while the length of the flexible mold should be slightly smaller than the circumference of the roller.

Figure 21:
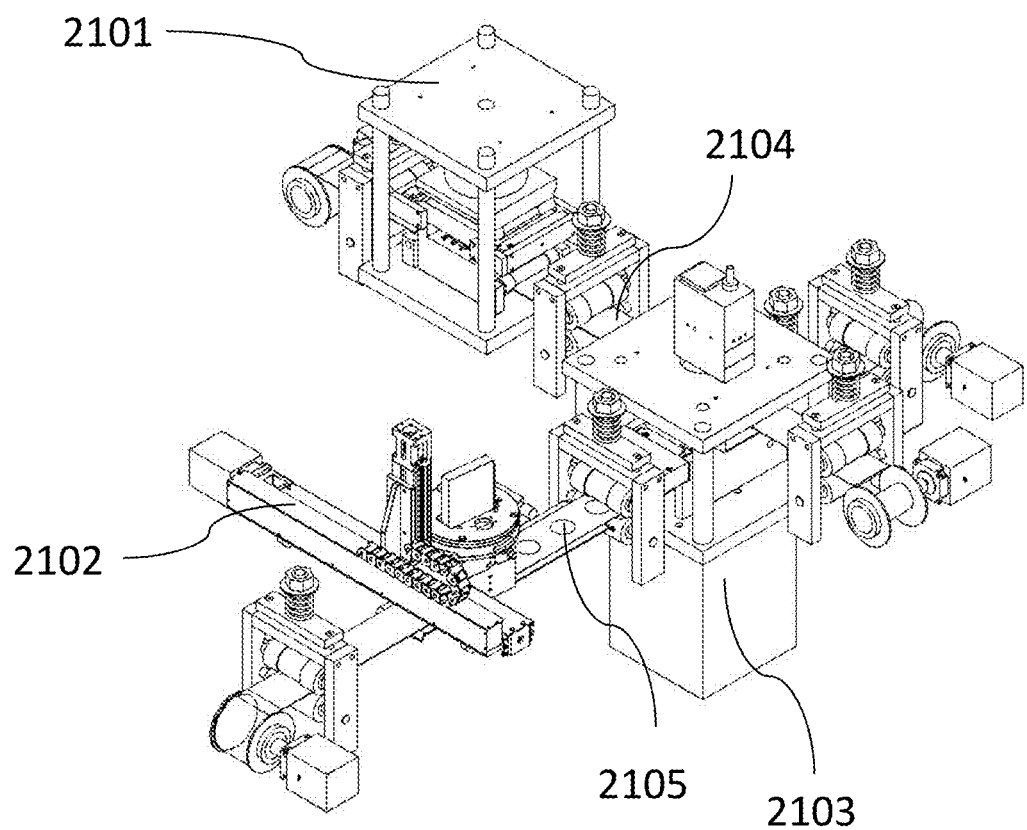
FIG. 21 illustrates a roller system using chamber for fluid pressure press.

FIG. 21 illustrates an alternative design of the roller imprint system where fluid pressure press may be carried out inside the chambers 2101 and 2103. Both mold and substrate uses flexible materials. Here 2102 is the resist dispensing system to place moldable material on the substrate. Chamber 2101 is used to duplicate an initial mold into a flexible material 2104. Then the patterned 2104 will be passed into a second chamber 2103, and imprint as a mold the pattern to flexible substrate 2105. Both chambers 2101 and 2103 can be pressured or vacuumed with their pressures controllable. High pressure reservoir, vacuum supply, and regulators are used in the system. Either UV light or thermal heating, or their mixtures can be used in any of the chambers 2101 and 2103.

Figure 22:
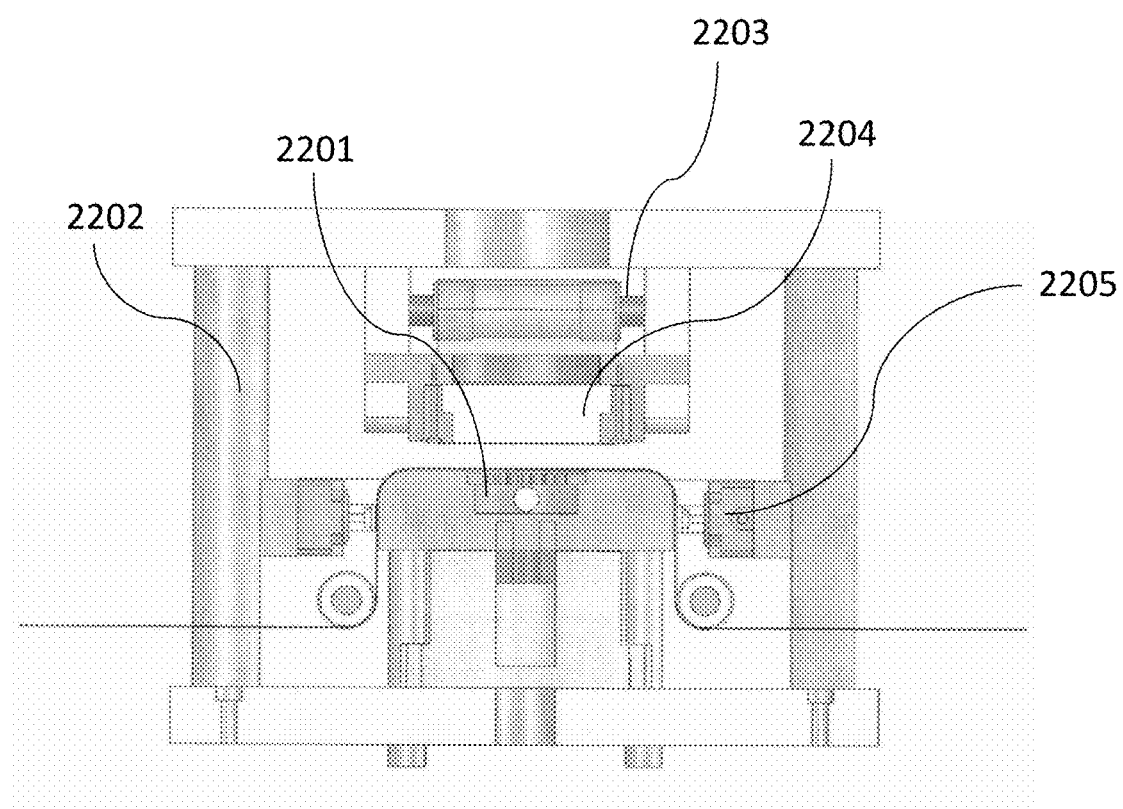
FIG. 22 illustrates chamber design in a roller system using fluid pressure press.
Figure 23:
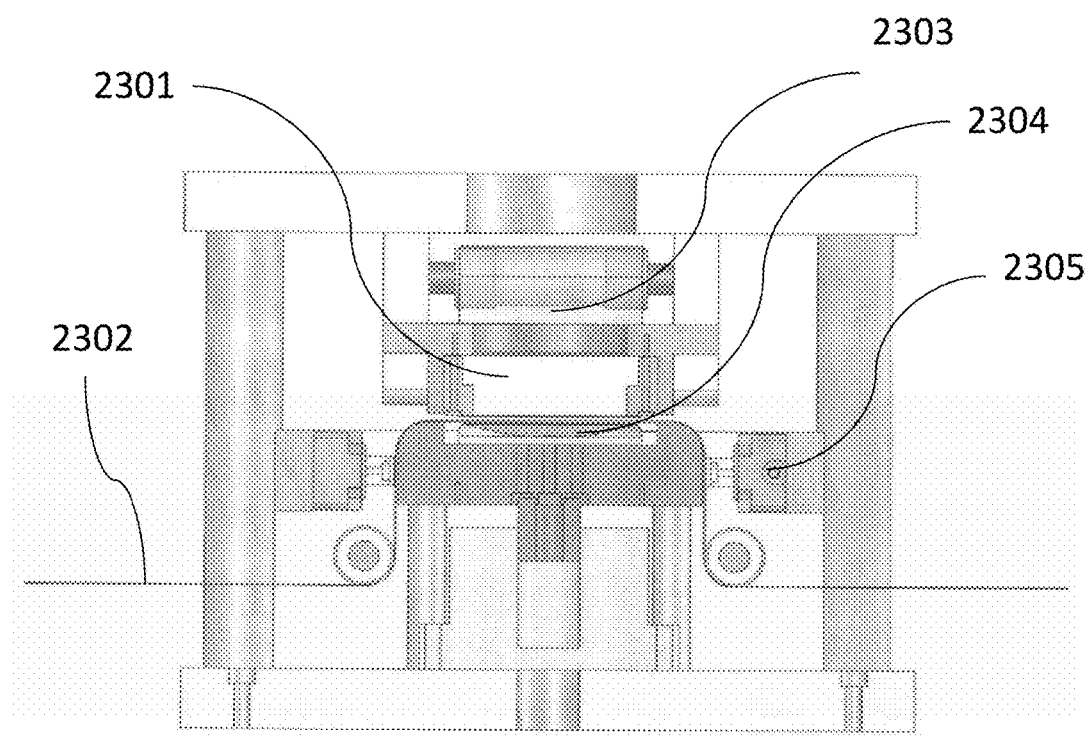
FIG. 23 illustrates chamber design in a roller system using fluid pressure press.
Figure 24:
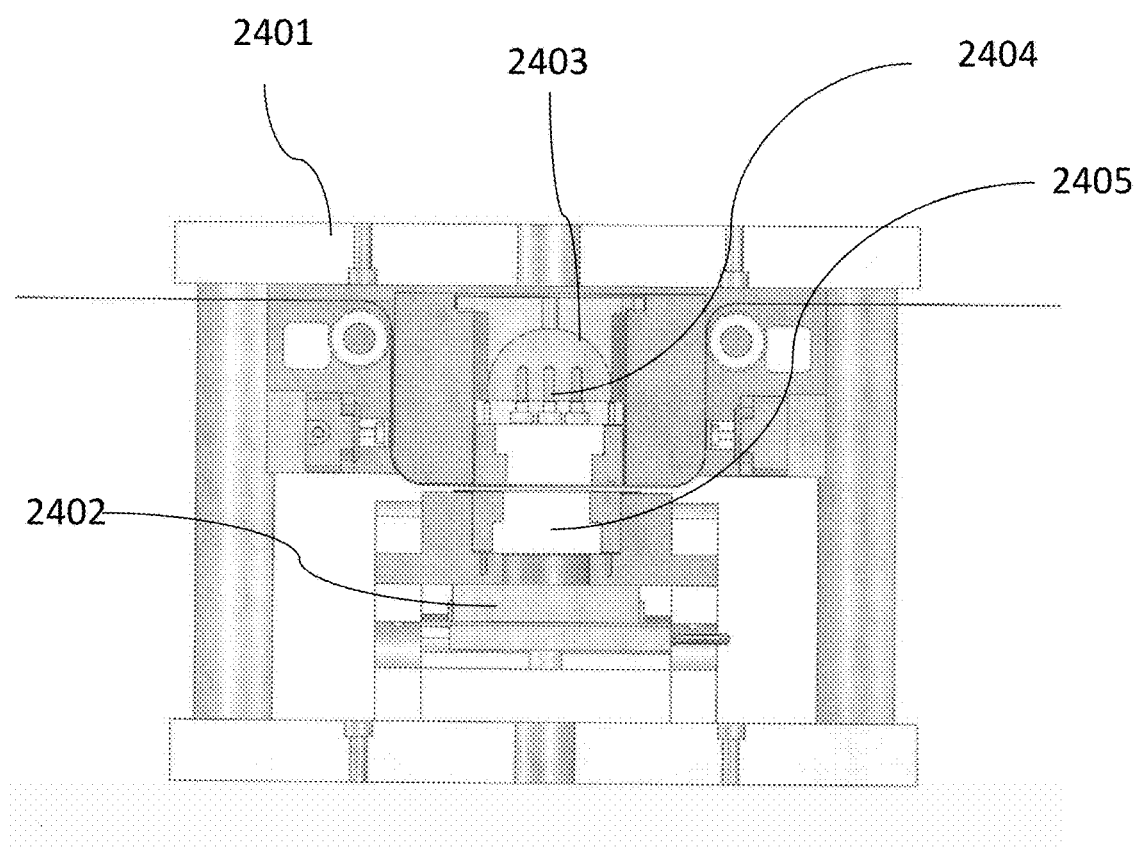
FIG. 24 illustrates chamber design in a roller system using fluid pressure press.

FIG. 22, 23, 24 further illustrates details of three different designs inside the chamber where the two different flexible materials, one for mold and one for substrate, imprint inside the chamber. The directions where the flexible mold and substrate move inside the chamber are vertical to each other (one along X, one along Y). FIG. 2205 is the clamp cylinder to control the belt. 2203 is the top roller to move the mold. 2302 is the substrate while 2303 is the mold. 2204, 2301 and 2405 are flat quartz plates. 2201, 2304, 2403 are small fluid chamber where imprint pressure will be applied. Generally in the designs, the fluid pressure from chamber provide the pressing.

The improvements possessed by the invention are emphasized again herein. The apparatus embodiments described in the invention accomplish roller imprinting using gas pressure. The special design Air Cushion Press (ACP) of the process is carried out for roller nanoimprint. The ACP not only provides very uniform imprinting force to achieve high pattern transfer fidelity, but also reduces possible damage to the imprint molds and substrates, both are crucial for manufacturing. The invention also provides ways to fabricate the roller mold, which is crucial for the full potential of the roller imprint technology.

It is to be understood that the above described embodiments are illustrative of only a few of the many embodiments that can represent applications of the invention. Numerous and varied other arrangements can be made by those skilled in the art without departing from the spirit and scope of the invention.

The descriptions assume that UV curable imprint is conducted if it is not clearly identified and UV curable imprint is used as example. However, the invention does not limit for UV curable imprint and also apply for thermo-plastic imprint. An ordinary person skilled in the art who is familiar with nanoimprint technology can easily revise the embodiment described in this disclosure to implement the concept of this disclosure for all type of imprinting.

This disclosure includes a system which can carry out high throughput step-&-repeat imprint: system includes, among other things, loader, dispenser system (with replaceable cartridge, resist reservoir and pump), imprint system, magnification control, gas/vacuum control, motion stages.

Figure 25:
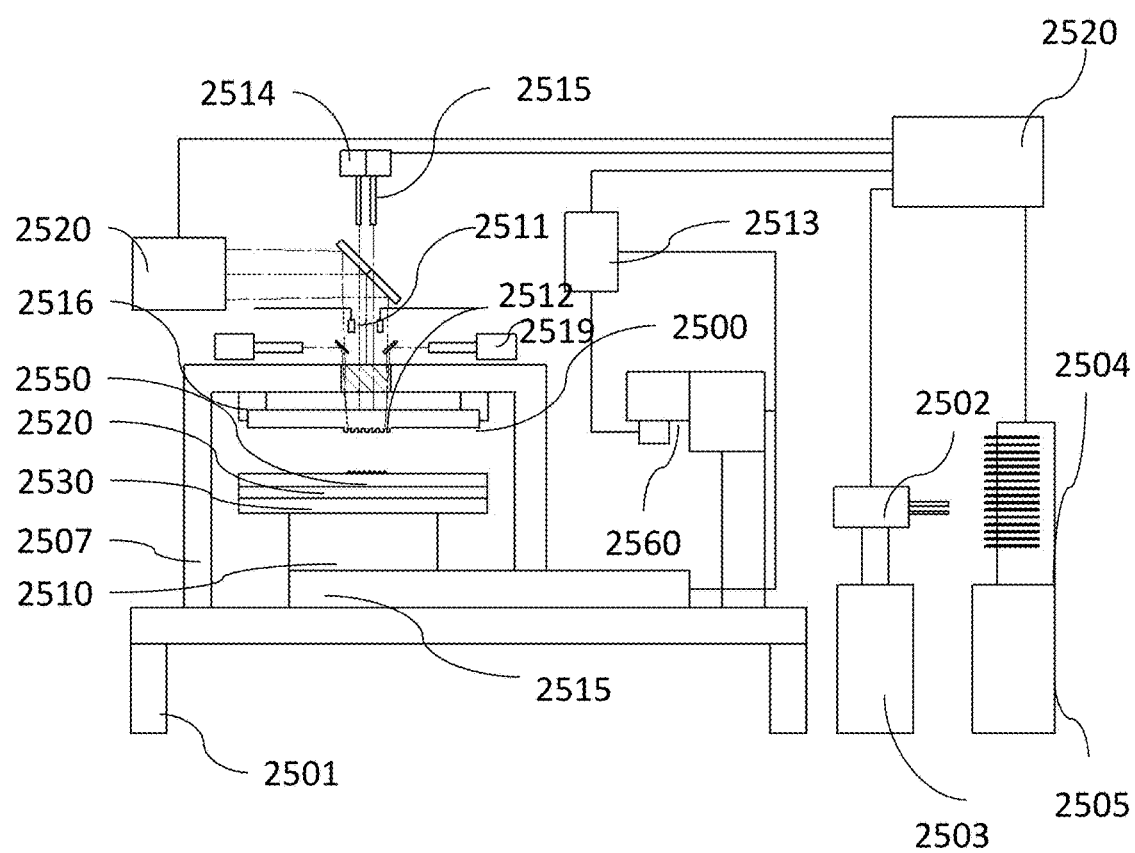
FIG. 25 is a schematic drawing of the system illustrating one exemplary embodiment.

In accordance with the concept of this disclosure, referring to FIG. 25, the step and repeat system has a gantry 2507 that holds the mold holder 2516. The gantry is mounted on a vibration controlled table 2501. A multi-axis robot 2503 with multiple end effectors 2502 is used to pick up molds and substrates from cassettes 2504. The cassettes are seated on front loaders 2505. The complete system is controlled by control system 2520 and PCs. A separate gantry is used to hold the dispensing system 2560. Top gantry may have an opening which allows alignment microscopes 2519 and 2515, CCD 2514, and laser gap sensors 2511 to see through. UV exposure light can also go through. The wavelength of UV is typically between 180-410 nm. Narrow band filters may be used to limit the wavelength. ~365 nm light may be used for exposure. In addition, UV LED light source may also be used. It typically has a central wavelength of 365 nm or 400 nm. It has a long lifetime, constant power density, and can instantly be turned on and off.

Both substrate 2550 and mold 2500 are held uniformly on their separate holders with minimum deformation. The substrate may be a standard 4", 6", 8", 12" or even 16" silicon wafer, while the mold may be a 6"×6"×0.25" thick quartz plate. The substrate may also be a semiconductor wafer or optical material such as sapphire. The center of the mold has a raised pedestal on the order of 1-50 um in height. Patterns are etched on top of the pedestal on the mold surface. The imprint die size, which is also the size of the raised pedestal, may be rectangular with a size of ~1"×1" or ~1"×1.5". The mold used for the apparatus may or may not need to be deformable under a reasonable differential pressure between its two sides. The mold could be made of quartz, glass, polymer, semiconductor, metal, or a mixture of some of the above materials. One example of the mold uses 8" diameter quartz or glass wafer with a substrate thickness 0.2-2 mm; another example of the mold uses 12" diameter quartz or glass wafer with a substrate thickness 0.2-2 mm; one more example of the mold uses 8" diameter Ni substrate with a thickness of 0.1-2 mm; yet one more example of the mold uses 200 mm diameter Si substrate with a thickness 0.1-2 mm.

The substrate is uniformly held on a substrate holder 2520. The system has a very long travel range stage 2515, together with stages 2530 of various moving axis. The travel range of X-Y stages guaranteed all regions of the substrate can be moved underneath the mold pedestal for imprint. It also allows the substrate to be moved under the dispenser system for resist application. The stages also provide the fine movement required for high accuracy alignment. Piezo, linear motor or air bearing stages may be used in the system. They can provide an accuracy of <1 nm. The stages also provide the Pitch-Roll motion, help making the surface of substrate to be in parallel with that of the mold. The multiple axis movement of the stage may be used to create the relative movement between mold and substrate after the imprint for an easy separation.

The system has a force sensing apparatus 2510. It is capable of detecting force from 10 grams to 45 kilograms. The sensitivity is around 0.5 gram. It serves as a mean to detect the mask and substrate contact points; it also helps to measure the separation force and control the separation process. A simple way to control separation may be to set a maximum value of force during the separation. Whenever the force is getting larger, the stage will adjust to minimize it.

Laser sensors and optical microscopes in the system may be used to accurately measure the gap between mold and substrate at three or more locations. This helps to level the surface of substrate to that of the molding surface of mold, and to locate the accurate contact height of mold and substrate. In addition, special gas sensors 3521 may also be used to measure the mold and substrate gap (referring to FIG. 35).

Figure 26:
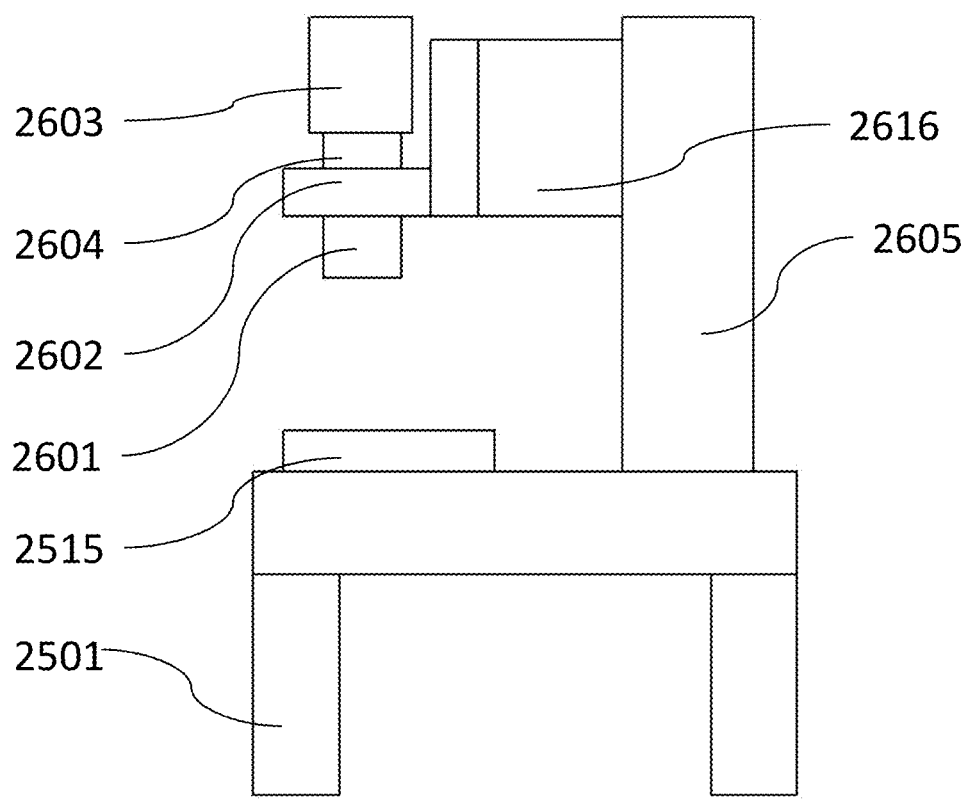
FIG. 26 is a schematic drawing illustrating the side view of the dispenser system.

Referring to FIG. 26, the side view of the dispenser system, the dispenser head 2601 is mounted on a rotation stage 2602 for resist droplet spacing adjustment. It also has a Z stage 2604 to adjust the head vertical position (Z axis) to dispense on the substrate, contact with the cleaning station 3703, and for camera observation of the resist droplets. A resist reservoir and pump is also attached to the head for continuous supply of resists during manufacturing. The dispenser head has 256 or 512 nozzles with a natural spacing 128, 256, or 512 um between them. There is also a long travel stage 2616 on the dispenser gantry 2605 which is vertical to the long substrate stage. They provided the necessary movement in X-Y to dispense on substrate.

Figure 27:
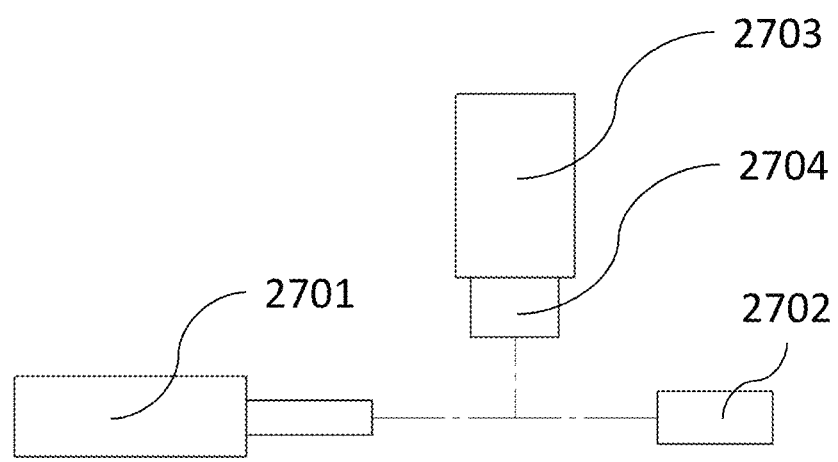
FIG. 27 illustrates the apparatus for observation resist dispensing.

Referring to FIG. 27, which is a resist dispensing observation system. A LED light source 2702 is used as illumination for the microscope and camera 2701. To avoid exposure of UV resists, a yellow filter is installed on the light source. The light source is synced with the frequency where the resist droplets are fired from the dispenser head, so the droplets can be seen and captured by the camera. By adjusting the dispensing profile (include the frequency, driving voltages, voltage profiles), an optimized and uniform dropping on substrate can be achieved.

Figure 28:
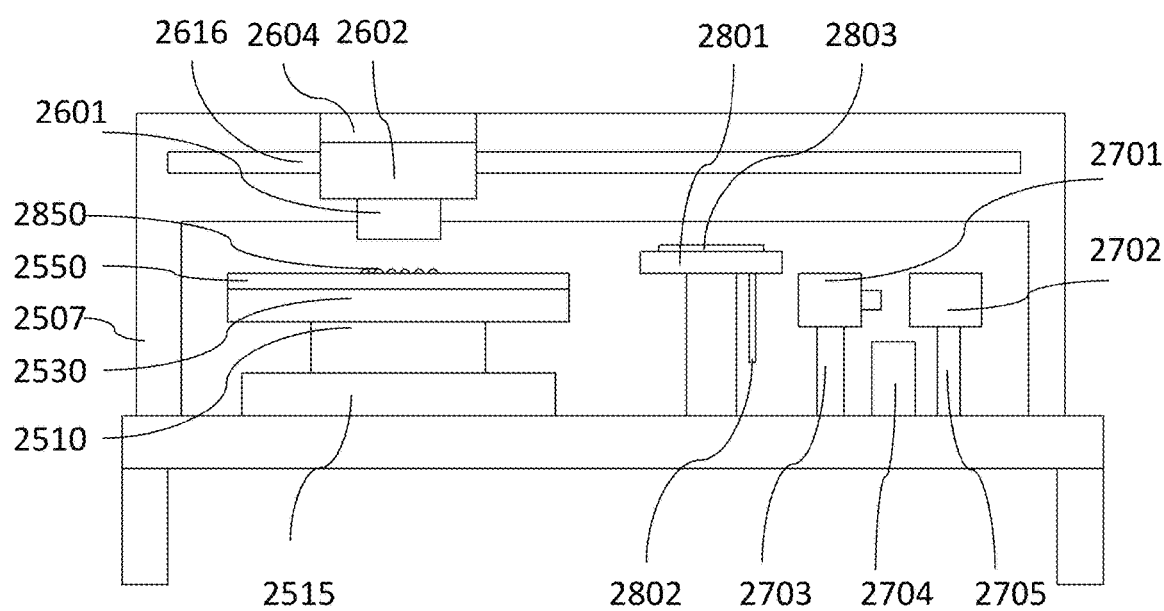
FIG. 28 illustrates the front view of the resist dispenser system.

Referring to FIG. 28, which is a front view of the dispenser system. The substrate 2550 can be brought underneath the head for dispensing. The gap between head and substrate during dispensing may be range from 100 um to 25 mm. Each droplet size can range from 1-100 pL. Resist viscosity can range from 1-200 cP. In the center of the dispensing system is a cleaning pad 2803. It can move in contact with the bottom of the dispenser head to wipe out the extra resists to keep it clean. The bottom of the cleaning station 2802 is connected to the exhaust. On the right is the resist observation station described in detail in FIG. 27.

Figure 29:
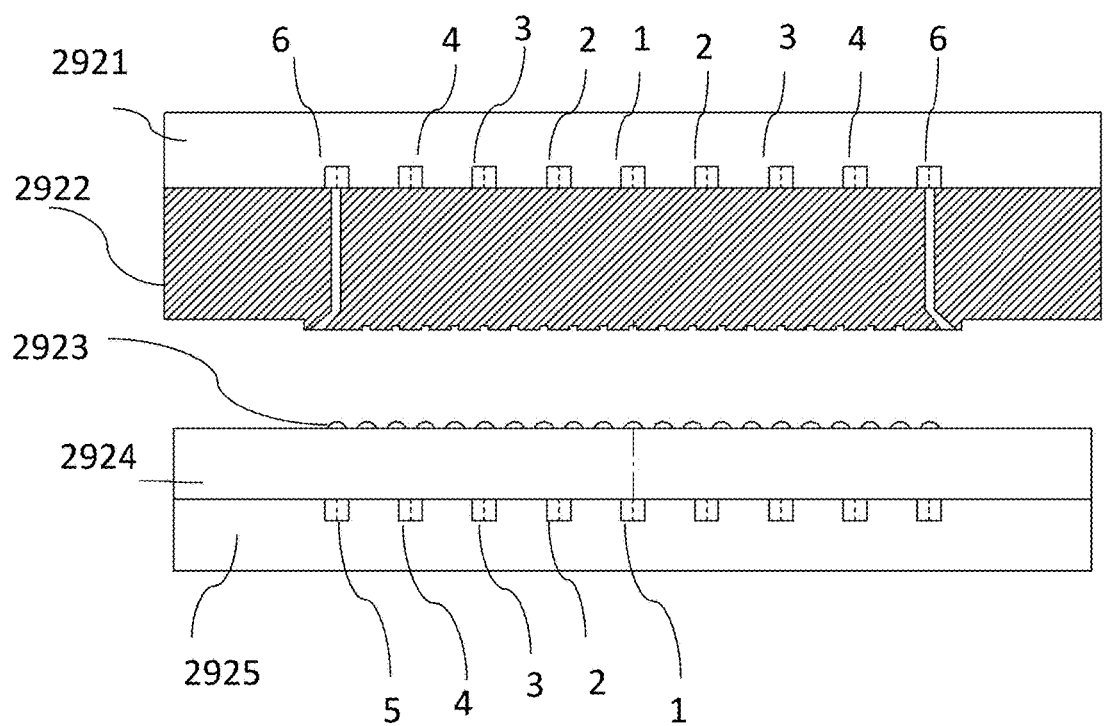
FIG. 29 illustrates a mold and substrate holder structure with a special designed mold.

There have been a few difficulties of the step-&-repeat imprint using dispensing resists. First the whole system is in atmosphere, therefore during imprint, it takes time for the air between the substrate and mold to go out. Resist droplet merging may push or dissolve some of the air. However it takes time for the merging process. Second, a mechanical force is used while the Air Cushion Press (ACP) has been proved to be the way for uniform imprint to meet the strict manufacturing requirements of many applications. FIG. 29, 30, 31, 35 shows a few approaches to solve these problems. They may be combined into the current system.

In our invention, a dropping resist merging and imprint in air are assisted by localized air pressure (on the back of mold or substrate). Meanwhile it may also be assisted by localized vacuum (generated by gas flow) and Helium may also be used.

Referring to FIG. 29, on both mold holder 2921 and substrate holder 2925, groups of vacuum/gas grooves are machined. They allow different area of the mold and substrate to be vacuum and pressured separately. To remove the air between the mold 2922 and substrate 2924 during imprint, group 1 can be pressured first, then group 2, 3, 4, and 5. This will bend the mold/substrate in the center, then gradually to the edge. It will squeeze the air out from center to the edge during resist droplet merging. After resist merging, extra pressures may be applied to the group of grooves which adds an air pressure during imprint, improving the imprint uniformity. Usage of these groups of grooves can also help to bending mold/substrate for separation after imprint. On the edge of the mold pedestal, channels 6 are also produced. This serves many functions. First, when there is a gas flow, it will push the air out, generating a vacuum in the center die area between the substrate and mold.

Second, Helium gas may be introduced here to help driving air out. Third, the gas used here may push mold and substrate to bend, helping separation after imprint.

Figure 30:
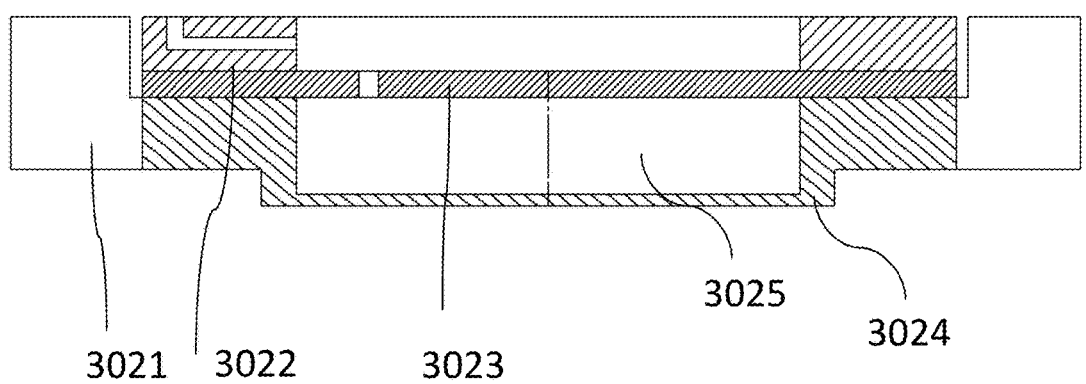
FIG. 30 illustrates a special designed mold structure.

Referring to FIG. 30, where a quartz plate 3023 may be bonded to the back side of a mold 3024. 3023 allows UV light to pass through to cure the sample. It also allows light to pass through for alignment. The mold has a very thin thickness in the center to begin with. After bonding, there is a small mini-chamber 3025 formed inside the quartz mold. There is no leakage of gas due to the bonding. As the total thickness of the bonded mold may be arranged to be the same as 0.25", the new mold can easily be loaded/unloaded using existing robot and cassette. The surface of the new mold may also be patterned with a raised pedestal (not shown in the figure) with micro or nano scale patterns on top. The advantage of this arrangement is it allows an air cushion press to be applied to the thin layer of quartz mold surface, improving the uniformity; it also allows the center of the mold to bend downwards contacting the substrate first to squeeze the air out during resist merging; it further allows the mold surface to be bended, helping separating mold from the substrate. 3021 can be used for magnification control of the mold here. 3022 is the mold holder.

Figure 31:
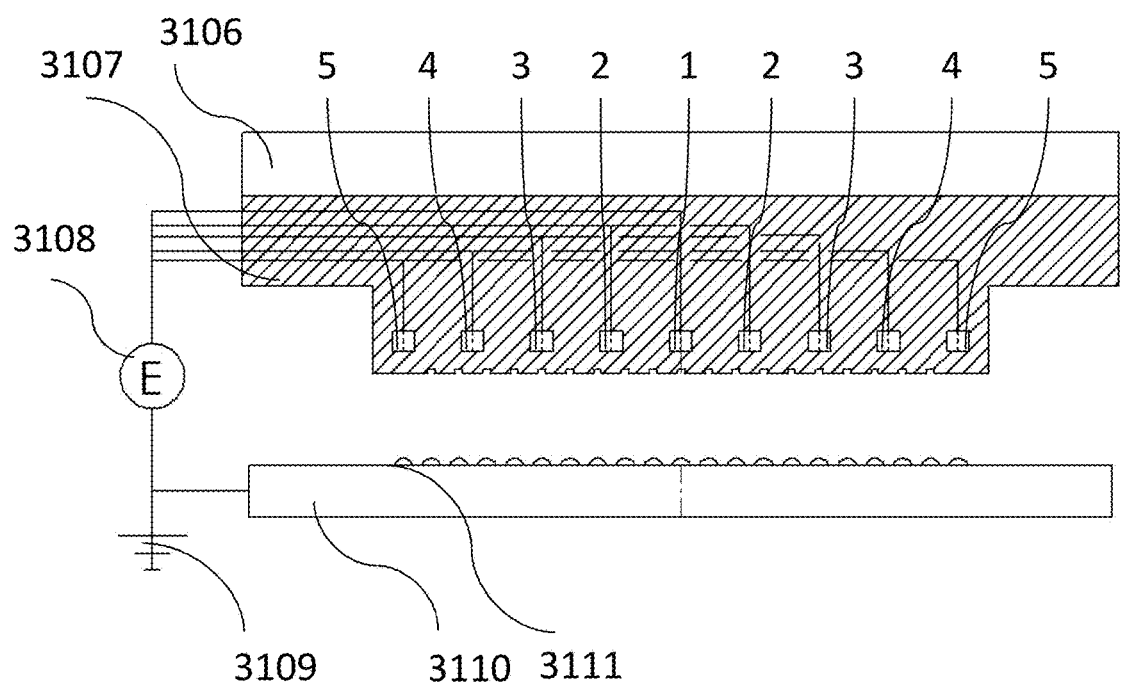
FIG. 31 illustrates a design and process for electrical field assisted dropping resist merging.

A dropping resist merging in air may also be assisted by electrical field. FIG. 31 shows an alternative method to help dropping resist merge in the air. Different sections of the mold pedestal area have transparent electrodes that are grouped as 1, 2, 3, 4, and 5. Applying an electrical field between mold and substrate will generate a force to imprint. By applying E-field in 1 first and then 2, 3, 4, and 5 will imprint center of mold 3107, then gradually to the edge, which helps to push the air out.

Figure 32:
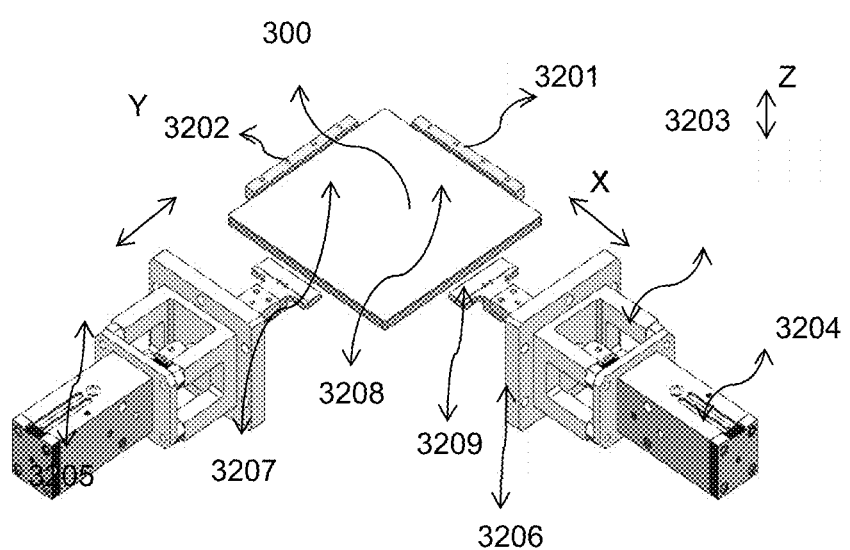
FIG. 32 illustrates the magnification control apparatus of the system.

FIG. 32 shows a magnification control apparatus in the system. In many applications, change the size of the mold to correct the dimension variation during various processing steps is critical. Piezo driven mechanical clamps is used to push the side surfaces of the mold 300. The force applied by the two piezo drivers will push the mold against the two mechanical stops on the other side. By controlling the force applied by the two piezos 3205, the deformation of the mold along X and Y direction can be controlled. Piezo driving mechanism may also be replaced by any other fine control movement apparatus. An accuracy air cylinder may also be used where the force sensor can be integrated on the head to accurately decide the force applied.

Figure 33A:
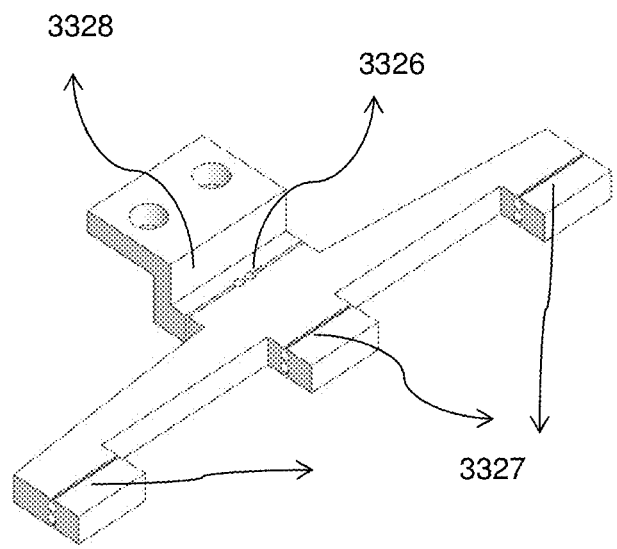
FIG. 33 illustrates the contact between magnification control and the side of the mold.
Figure 33B:
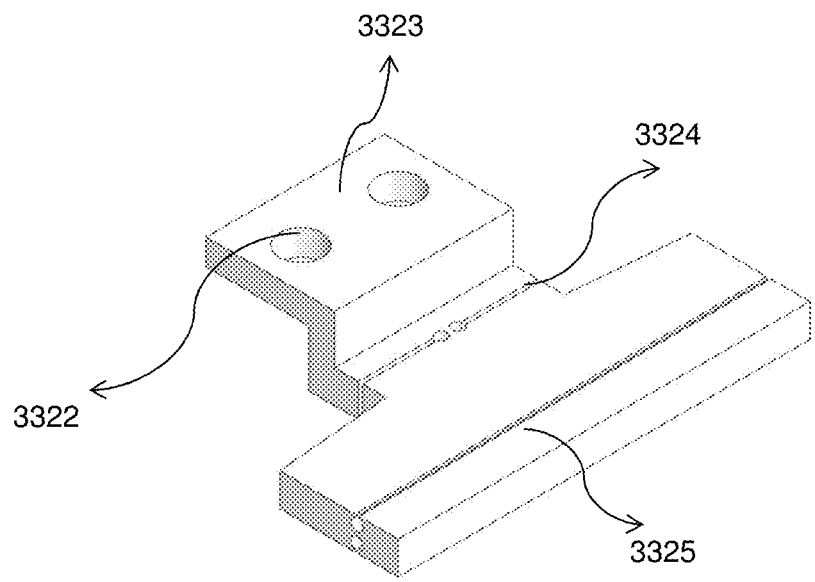

FIG. 33 further shows detailed structure of the clamp heads designs. By using compliant flexure structures 3326, 3327, 3324, and 3325, the head of the clamp is capable of compensating for minor rotation of mold relative to the push piezos along X, Y and Z directions, therefore applying a uniform force on the mold. The distortion of the pattern is minimized.

Figure 34:
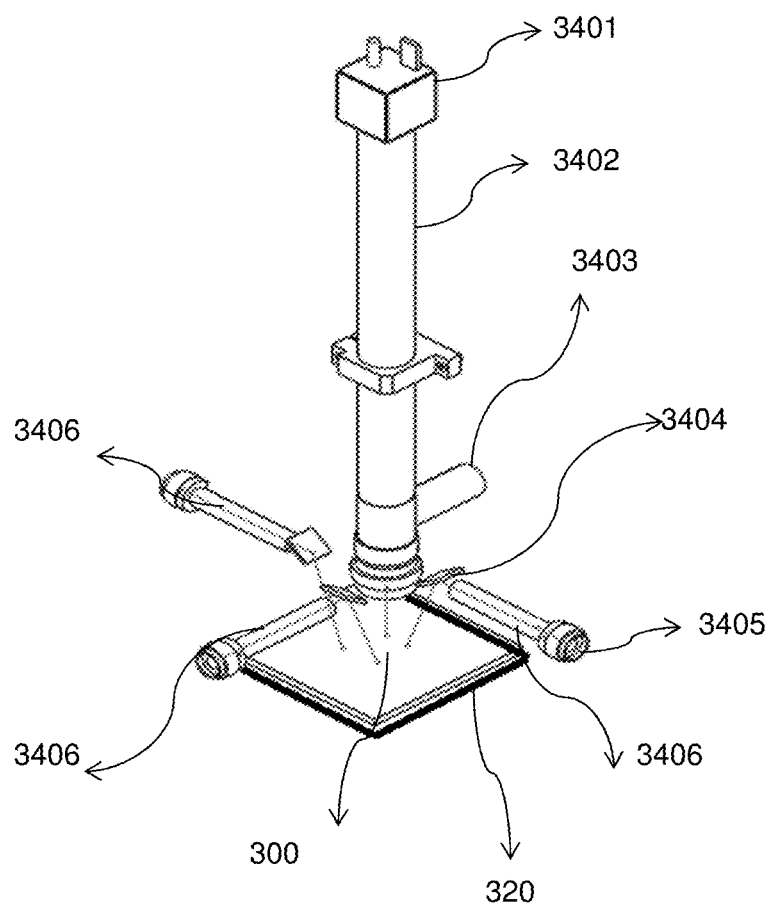
FIG. 34 is a schematic drawing of the alignment apparatus of the system.

FIG. 34 shows the system alignment apparatus. Alignment apparatus in the system has four microscopes. Three of them are titled while one of them is vertical. The vertical microscope 3402 has higher NA than the other three titled microscopes, and is used for coarse alignment of substrates to the mold. The titled microscopes 3406 will use moiré alignment marks on both the mold and the substrate to read the miss-alignment between them at different locations. Depending on the type of mold 300 to be used, the wavelength of illumination lights for the microscopes can be either in visible (400 nm-800 nm) or IR (800 nm-2000 nm) range. To prevent illumination lights from exposing the imprint resists, UV block filters are used in the illumination paths. Alternatively, two vertical microscopes may also be used for both the coarse and fine alignment. They will read moiré alignment marks from both mask and substrate.

Figure 35:
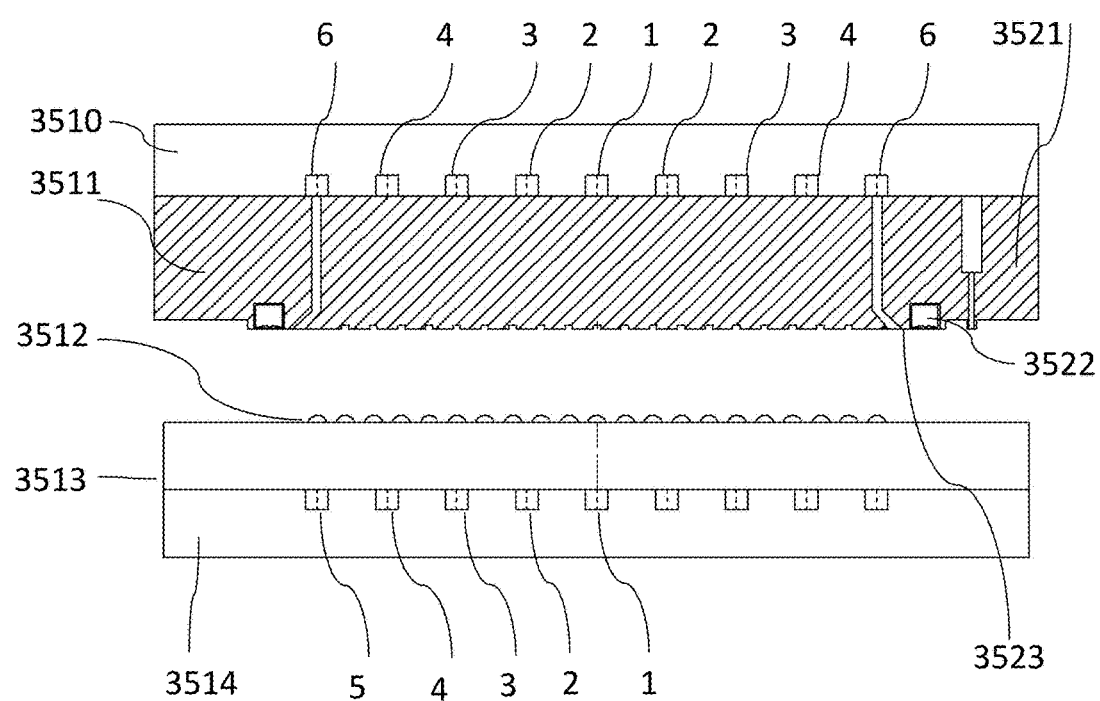
FIG. 35 illustrates a special designed mold structure using O-ring and gas gap sensor.
Figure 36:
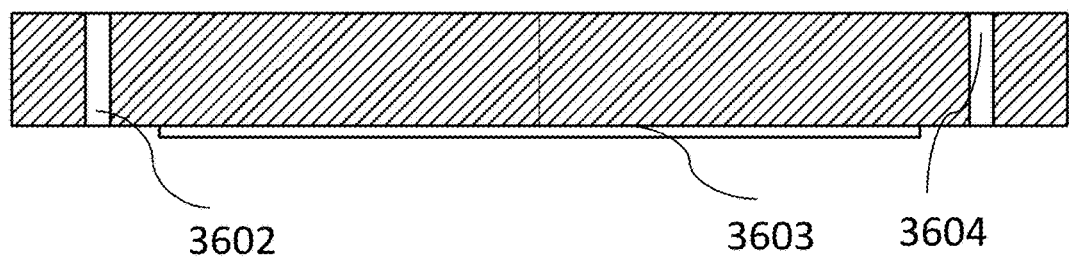
FIG. 36 illustrates an imprint mold design with gas gap sensor integrated.
Figure 37:
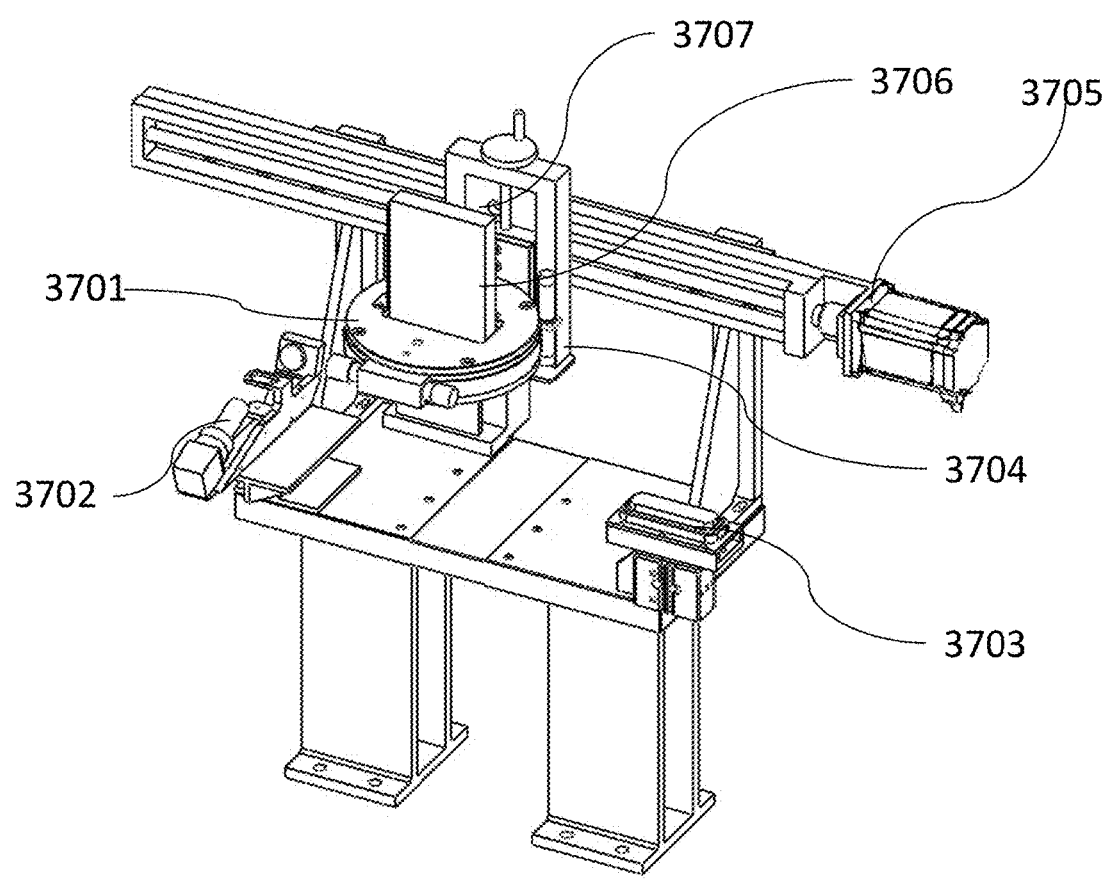
FIG. 37 illustrates a dispenser system for placing moldable material on substrates.

FIG. 35 shows an alternative mold structure where seal O-ring and gas sensor is built into the mold. The special designed mold with inflatable O-ring 3522 which allows the usage of spin on resists, and helps dropping resist merging by vacuum out the air between substrate 3513 and mold 3511. The gas channel 3521 on the mold can also be used as gas gap sensor. The O-ring also helps with the separation. The vertical gap sensors 3521 can measure the gap between the mold and substrate when their gap is less than 250 um. Multiple sensors at 3 different locations can help substrate leveling to the mold; it also helps to determine the exact gap between mold and substrate; in addition, the gas can help pushing mold and substrate to separate first at a few locations after imprint. The O-ring in the mold can inflate before the imprint process, and then groove 6 can help evacuate the air between the mold and substrate in the center. After that, the O-ring may graduate retract, with the help of substrate stages to bring substrate and mold in contact under a local vacuum. Extra advantage of this design is it will allow the usage of spin on resists. FIG. 36 shows yet another design where the mold 3603 can have through holes 3602 on it for using as gap sensing and separation.

In the step and repeat process, a mold for imprinting is held against a mold holder by using vacuum or mechanical clamp means. The mold holder is hollow. A central patterned region of mold to be freely accessible from underneath side, top side or both sides. The mold holder is securely tightened to the gantry. Different mold holders may be used to accommodate mold of different dimensions. The surfaces in contact with the mold on the mold holder are uniform, which can hold the mold with a minimum deformation. The mold holder is positioned to have patterned region exposable through opening section of gantry, and accessible from underneath.

A substrate for imprinting is held on chuck by vacuum pumping through the vacuum grooves. Surface of chuck are designed and special polished in order to hold the substrates with minimum deformation. The substrate may have a moldable material applied on its side surface facing the mold before imprint begins. The moldable material could be a plurality of droplets of imprinting resist dispensed on. When the moldable material is in form of a plurality of droplets before imprinting, the distribution of the droplets could be a uniform matrix of equal spacing among adjacent droplets along one direction or multi directions, or an arbitrary matrix optimized for merging each to achieve desired imprinted patterns, or optimized to the mold pattern density to get the most uniform imprint. In additional to these general demands for imprinting, the special distribution of droplets is preferred to deliver a uniform and continuous contacting interface between the mold and the substrate during the imprint process of the apparatus.

At each die, at beginning of the imprint process, substrate is positioned to a starting position which normally has a larger than 0.5 millimeter gap between the substrate and the mold. Gap measuring sensors are used to detect mold and substrate gaps at 3 different locations. Then the substrate is adjusted until all the gaps are the same. This means the substrate surface is in parallel with the mold surface. Alternatively, the gap may be measured using microscopes and alignment marks on the mold and substrate. In addition, by observing the interference pattern between the mold and the substrate, the substrate surface may also be adjusted to be in parallel with the mold surface.

Next the imprint process is to bring mold and substrate close to carry out alignment. Normally, aligning the substrate and the mold is accomplished by positioning an align marker on the substrate overlapping with a matching align marker on the mold under microscopes.

By using the vertical microscope and alignment marks on the substrate and mold, the substrate is first moved to coarsely align with the mold. This will remove the small error generated during loading and machine assembling, and make sure the fine alignment marks on the mold and substrate are located in the same field of view, therefore no further searching of alignment marks necessary, significantly improving the alignment speed and reliability, which are required for manufacturing. If fine alignment (<250 nm) is required, the 3 titled microscopes will then read misalignments at 3 different locations by using the fine alignment marks. The finer X, Y, and rotation error can be further corrected by substrate stages.

The substrate may be moved up to contact with the mold under a controlled push by the stage assembly while remove the air. The top moldable surface on substrate is adjusted in parallel with mold molding surface by the coarse leveling mechanism and optional fine leveling mechanism stage assembly before the final contact. Laser sensors and force sensors can be used to locate the exact contacting point and contact force. To accomplish the contact step, substrate is moved up slowly until there is a slight controllable contact force between the mold and substrate reached. Then the substrate is continued moved up by Z while the Pitch and Roll of the stages are adjusted to keep the contact force low. The initial contact force prevents relative movement between the mold and the substrate, therefore maintaining the relative position between them.

When the contact step is accomplished, the moldable material has been pressed lightly and redistributed to fill space between the mold and the substrate. For case of using very low viscosity moldable material, the press caused by the contact may be sufficient to imprint patterns of the mold into the moldable material. In order to guarantee quality of patterns imprinted, it may need to apply higher pressure press on the mold and the substrate than the contact.

Higher pressure press may be applied on the mold and the substrate by filling mold mini-chamber with high pressure gas. Air Cushion Press (ACP) is realized during this step for imprinting. Details of Air Cushion Press are described by Stephen Y. Chou in U.S. Pat. No. 6,482,742 under a title of "Fluid Pressure Imprint Lithography".

After the moldable material redistributes to completely fill every space between the mold and the substrate, then, it is consolidated to solid by a UV exposure. Finally, the high pressure gas for ACP is vented to atmosphere. So far, pattern formation of imprinting is completed. The substrate is ready for being released from the mold.

One can separate mold and substrate by generating relative movement between them: this can be accomplished by peeling substrate from mold; by inflatable O-rings; by gas flow; or by a combination of these methods. Separation may also be implemented by bending of mold or substrate, either at an edge, in the center, either symmetric or non-symmetric.

The separation can be realized by combining mold deformation and stage movement. A way to separate the substrate from the mold starts from positioning chuck underneath substrate at a predetermined gap. Then, a differential pressure between mold mini-chamber and air is introduced to deform the mold. As deformation is enlarged by increasing the differential pressure, substrate loses contact from the mold starting from die periphery and expanding toward die center. The differential pressure reaches a predetermined value so that back side of substrate completely contacts with chuck. By now, a significant peripheral region of the substrate is released from the mold and central region of the substrate is not yet. After that, the substrate is held against chuck by pumping back side of the substrate through the vacuum grooves on the chuck surface. Finally, the established differential pressure is removed to restore the mold backward its original shape. Because the substrate is vacuum held against the chuck, the remaining central area of the substrate is separated from the mold. The substrate stays on chuck after the separation ready for next die imprint and the mold is returned to its starting status.

Alternative ways to separate the substrate from the mold are through the relative movement of mold and substrate. These ways share a common concept that use both vacuum and mechanic means to hold the mold and the substrate, and pull the substrate in certain way using the stage assembly to create the motion to separate. The mold may be intentionally deformed to further facilitate the separation. The separation starts from vacuum holding back side of substrate against top surface of chuck by pumping through the vacuum groves on the chuck. One way to separate is to pull substrate downward by moving the stage assembly down. Because the substrate is held against the vacuum grooves on the chuck and the mold is deformable, at beginning of the pull, the mold is deformed so that one corner of the substrate is separated first. As the downward pulling is progressing, the separated region of the substrate propagates from the firstly separated periphery inner ward the center. At end of the downward pulling, the substrate is completely separated from the mold.

Alternatively, the separation motion of the substrate can be much more complex than a simple downward pulling motion to best separate the substrate from the mold, reducing the possible damage to nano-scale patterns and improving separation speed. The stage holding the substrate in the system may be capable of 6 axis motion movements, therefore the substrate can move with its motion and speed accurately controlled. The separation may include movements of multiple steps with the speed and direction of each movement be controlled. In one example, the substrate moves in both Roll and Pitch motion, and at the same time moves down in Z: the combination movement will peel the substrate from the mold diagonally. In another example, the separation include 2 step movements: first the substrate moves down in Z while going through Roll motion, then it moves down in Z going through Pitch motion. Further, the separation may be paused, waiting for the further propagation of separation boundary.

The separation completion may be detected by sudden changing of vacuum reading at the system and mold/substrate holders; it may be detected by the recorded force during separation or a sudden change of force reading; it may also be detected by processing the camera images from top view of the die area during separation and finding the time where the contact area disappeared.

When on die imprint is finished, the substrate stage will move the substrate underneath the resist dispensing system if dispensing resist is to be used. After dispensing, the stage will move the substrate to the next position.

To improve the throughput of the system, resist droplets with low evaporation rate may be used. All the resist droplets may be dispensed at a time on all the dies of the substrate. Then the substrate does not have to come back to dispenser station each time for dispensing.

The improvements possessed by this disclosure are emphasized again herein. The apparatus embodiments described in this disclosure accomplish a full cycle of imprinting inside the chamber through a process essentially involving deforming the mold and positioning the substrate by the stage assembly. The speed to finish each step of the process is primarily decided by stage response and how fast to deform the mold. Using state-of-art stage technology, stage response can be very fast and capable of responding to requests of each step well within seconds. Furthermore, the chamber uses vacuum to eliminate possibility of trapping air between the mold and the substrate. The Z stage required for the process is placed outside of chamber, which significantly reduced the chamber volume, therefore reduced the time for vacuum and pressure the chamber, increased the throughput. The special ring seal design inside chamber allows the intrinsic Air Cushion Press (ACP) of the process to be carried out for nanoimprint. The ACP not only provides very uniform imprinting force to achieve high pattern transfer fidelity, but also reduces possible damage to the imprint molds and substrates, both are crucial for manufacturing.

It is to be understood that the above described embodiments are illustrative of only a few of the many embodiments that can represent applications of this disclosure. Numerous and varied other arrangements can be made by those skilled in the art without departing from the spirit and scope of this disclosure.

When describing elements or features and/or embodiments thereof, the articles "a", "an", "the", and "said" are intended to mean that there are one or more of the elements or features. The terms "comprising", "including", and "having" are intended to be inclusive and mean that there may be additional elements or features beyond those specifically described.

Those skilled in the art will recognize that various changes can be made to the exemplary embodiments and implementations described above without departing from the scope of the disclosure. Accordingly, all matter contained in the above description or shown in the accompanying drawings should be interpreted as illustrative and not in a limiting sense.

It is further to be understood that the processes or steps described herein are not to be construed as necessarily requiring their performance in the particular order discussed or illustrated. It is also to be understood that additional or alternative processes or steps may be employed.

What is claimed is:

1. A system for patterning substrate surfaces, comprising:
a mold having a molding surface with a patterning area;
a mold holder releasably coupled to the mold;
a substrate having a molding surface not smaller than the patterning area of the mold, wherein the molding surface comprises a moldable material disposed thereon;
a stage having the substrate disposed thereon, wherein at least one of the mold holder and the stage comprise means for moving between a first position wherein the mold holder and the stage comprise a gap therebetween, and a second position wherein the molding surface of the substrate and the patterning area of the mold are in contact;
one or more contact force sensors positioned along the system for sensing one or more forces;
a pressure regulator fluidly coupled to the system;
a gas reservoir fluidly coupled to a chamber containing the mold holder and the stage, wherein upon delivery of a high pressure gas from the gas reservoir to the chamber when the mold holder and the multi-axis stage are in the second position the molding surface of the mold is pressed against the molding surface of the substrate, thereby imprinting a nano-scale pattern or a micro-scale pattern onto the molding surface;
at least one vacuum pump fluidly connected to the chamber;
a material dispensing system constructed and arranged to dispense the moldable material on the substrate;
two or more rollers constructed and arranged to move at least one of the substrate and the mold; and
a light source and reflective optics constructed and arranged to expose the substrate to light.

2. The system of claim 1 wherein the material dispensing system further comprises a gantry, a resist dropping head, one or more resist observation microscopes, a camera, a light source, a resist cleaning station, a resist reservoir, driving electronics and software, a multiple axis stage to control vertical dropping gap and resist droplet spacing on substrate.

3. The system of claim 1 wherein the moldable material is disposed on the substrate as droplets uniformly, according to a pattern density on the mold, or arranged in a way so two or more adjacent droplets merge together to drive out air quickly.

4. The system of claim 1 wherein the mold holder is constructed and arranged to change the mold size using piezo drives, or an air cylinder with accurate pressure control.

5. The system of claim 1 wherein the substrate comprises a standard wafer of 4", 6", 8", 12", or 16".

6. The system of claim 1, wherein the substrate comprises a material selected from the group consisting of Silicon, semiconductor, and other optical material.

7. The system of claim 1, wherein the mold can be a standard quartz plate of 6" by 6" by 0.25" thickness with a smaller die size in the center, raised as a pedestal with height 1-50 um.

8. The system of claim 1, further comprising a vapor treatment chamber to coat vapor of one or more chemicals on at least a portion of the mold or at least a portion of the substrate.

9. The system of claim 1, wherein the means for moving between the first position and the second position comprises an air cushion press (ACP).

10. The system of claim 9, wherein the pressure regulator and a manifold are constructed and arranged to change a pressure inside the ACP.

11. The system of claim 9, wherein the ACP comprises an ACP head, and wherein the ACP head comprises:
a housing with one open end;
a light reflector;
lens for focusing and expanding light;
a UV light source, a thermal light source, or a combination thereof; and
at least an opening hole for fluid coupling to the gas reservoir.

12. The system of claim 1, wherein the stage comprises a multi-axis stage.

13. The system of claim 1, further comprising a robot system for automatically loading and unloading at least one of the substrate and the mold.

14. The system of claim 1, further comprising a microscopic system for measuring a spatial relation between the mold and the substrate at multiple locations.

15. The system of claim 1, further comprising a gantry for holding the mold holder.

16. The system of claim 1, further comprising a manifold fluidly coupled to the system.

17. The system of claim 16, wherein the pressure regulator and the manifold are constructed and arranged to change a pressure inside the chamber.

18. The system of claim 1, further comprising a vibration control table.

19. The system of claim 1, wherein the light source is a UV light source.

20. The system of claim 1, wherein the mold holder comprises a center opening.

21. The system of claim 1, further comprising means for (i) pressing a first area of the substrate using the mold, (ii) separating the substrate and the mold, and (iii) pressing a second area of the substrate using the mold.

* * * * *